United States Patent
Fukutome

(10) Patent No.: US 8,362,530 B2
(45) Date of Patent: Jan. 29, 2013

(54) SEMICONDUCTOR DEVICE INCLUDING MISFET AND ITS MANUFACTURE METHOD

(75) Inventor: Hidenobu Fukutome, Kyoto (JP)

(73) Assignee: Fujitsu Semiconductor Limited, Yokohama (JP)

( * ) Notice: Subject to any disclaimer, the term of this patent is extended or adjusted under 35 U.S.C. 154(b) by 89 days.

(21) Appl. No.: 12/964,318

(22) Filed: Dec. 9, 2010

(65) Prior Publication Data

US 2011/0089474 A1   Apr. 21, 2011

Related U.S. Application Data

(63) Continuation of application No. PCT/JP2008/001653, filed on Jun. 25, 2008.

(51) Int. Cl.
*H01L 29/76* (2006.01)

(52) U.S. Cl. ............ 257/288; 257/E21.318; 257/E29.04

(58) Field of Classification Search .................. 257/288, 257/E21.318, E29.04
See application file for complete search history.

(56) References Cited

U.S. PATENT DOCUMENTS

| 2006/0001108 A1 | 1/2006 | Yamamoto |
| 2006/0049430 A1 | 3/2006 | Kasai et al. |
| 2006/0289905 A1 | 12/2006 | Kito et al. |
| 2007/0007619 A1 | 1/2007 | Yamamoto |
| 2007/0278585 A1 | 12/2007 | Dyer et al. |
| 2007/0296053 A1 | 12/2007 | Hasunuma et al. |

FOREIGN PATENT DOCUMENTS

| JP | 6-021452 A | 1/1994 |
| JP | 2006-019661 A | 1/2006 |
| JP | 2006-060039 A | 3/2006 |
| JP | 2007-005568 A | 1/2007 |
| JP | 2007-194337 A | 8/2007 |
| JP | 2007-220783 A | 8/2007 |
| JP | 2007-329346 A | 12/2007 |
| JP | 2007-329474 A | 12/2007 |
| WO | 2005/122272 A1 | 12/2005 |

OTHER PUBLICATIONS

Sung, C. Y. et al. "High Performance CMOS Bulk Technology Using Direct Silicon Bond (DSB) Mixed Crystal Orientation Substrates," Electron Devices Meeting, Dec. 5, 2005, pp. 225-228, cited in spec.
International Search Report of PCT/JP2008/001653, mailing date Sep. 30, 2008.
English Translation of Written Opinion of PCT/JP2008/001653, mailing date Sep. 30, 2008.

*Primary Examiner* — Kimberly Rizkallah
*Assistant Examiner* — Marvin Payen
(74) *Attorney, Agent, or Firm* — Westerman, Hattori, Daniels & Adrian, LLP

(57) ABSTRACT

An active region made of Si or SiGe is formed in a surface part of a substrate. A gate electrode is disposed over the active region. A gate insulating film is disposed between the gate electrode and the substrate. A source and a drain are formed in the surface part of the substrate on sides of the gate electrode. A surface of the active region under the gate electrode includes a slope surface being upward from a border of the active region toward an inner side of the active region. The slope surface has a crystal plane equivalent to (331).

11 Claims, 22 Drawing Sheets

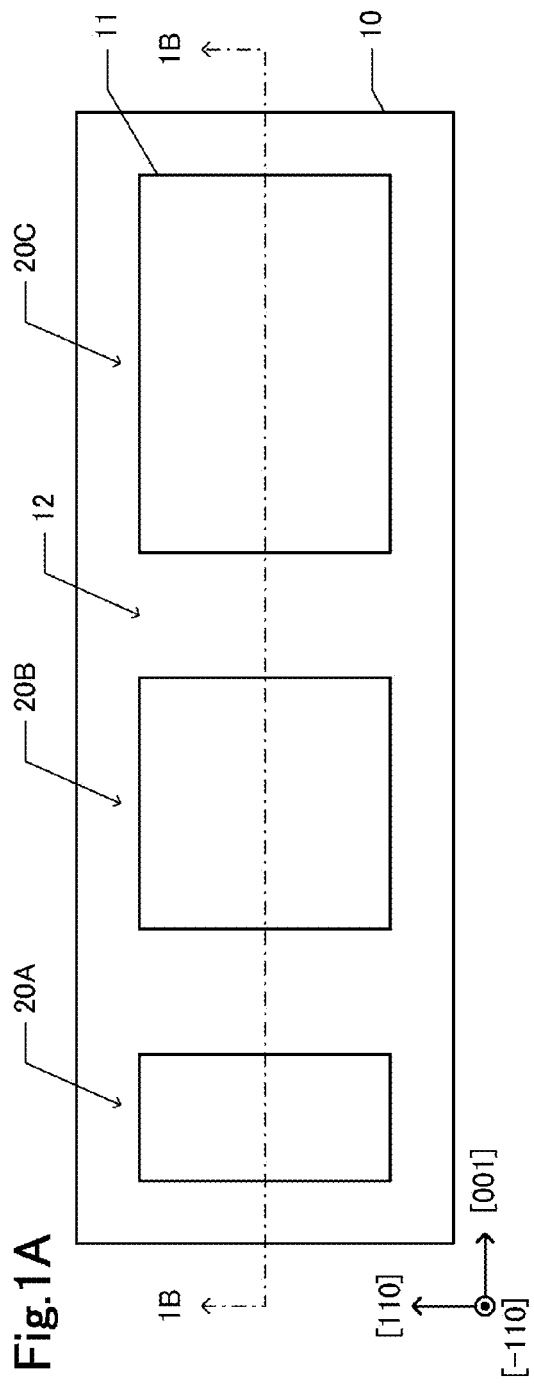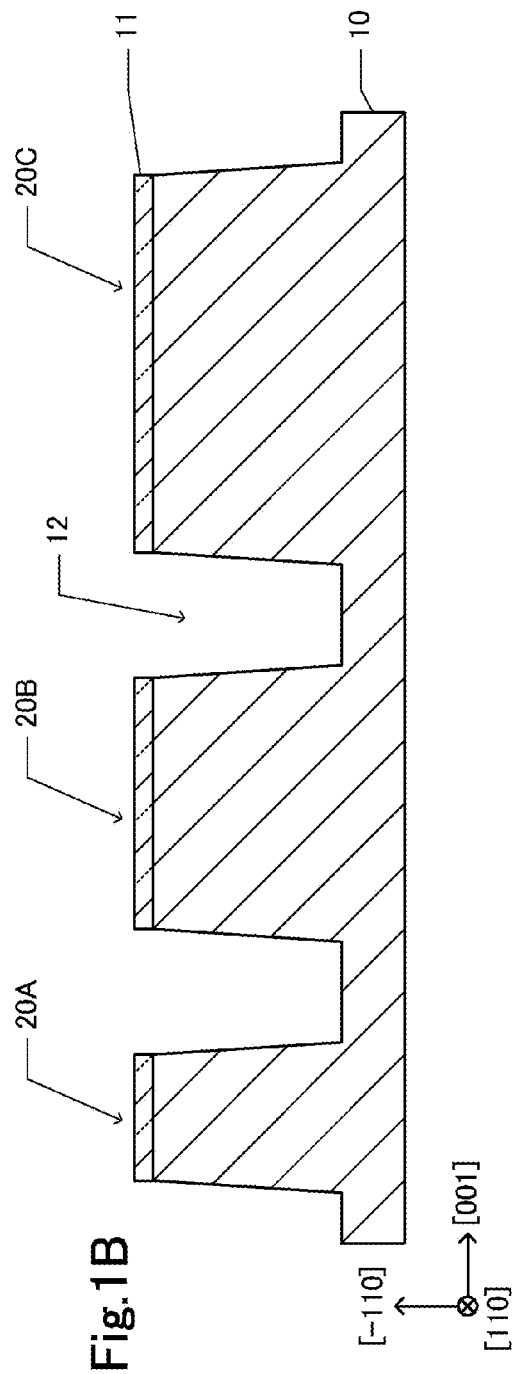

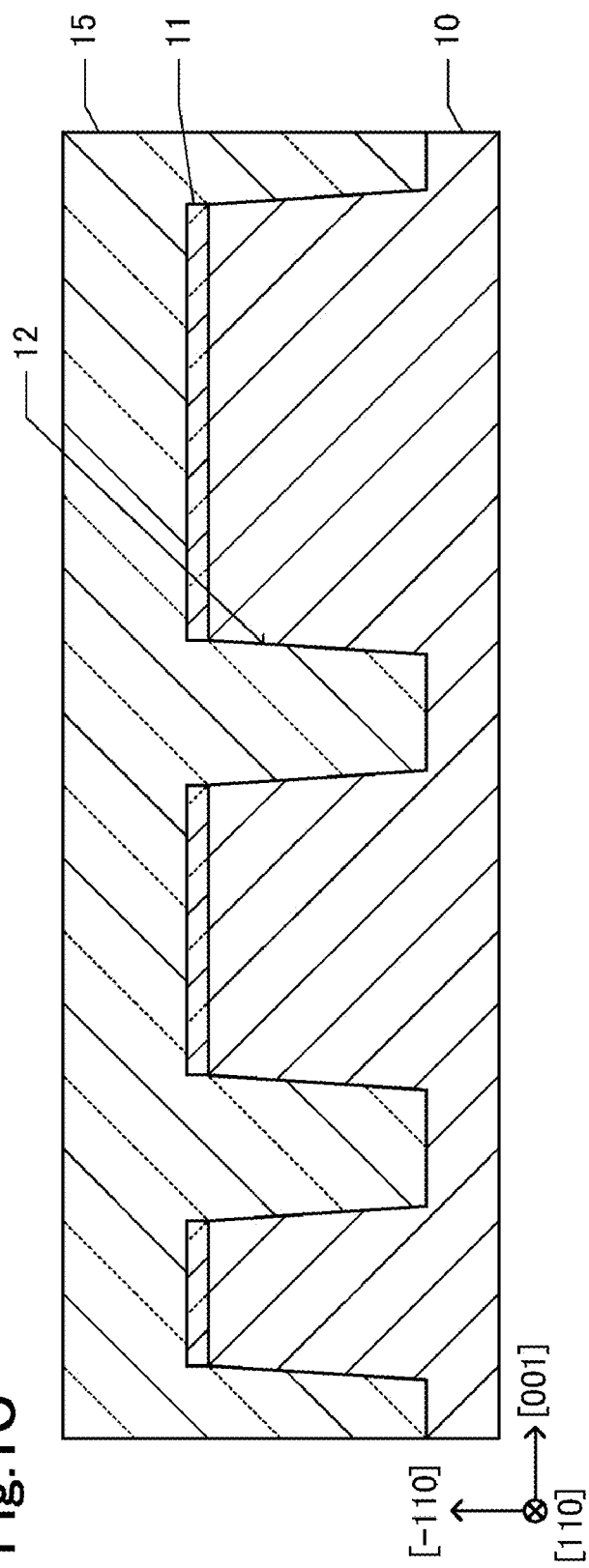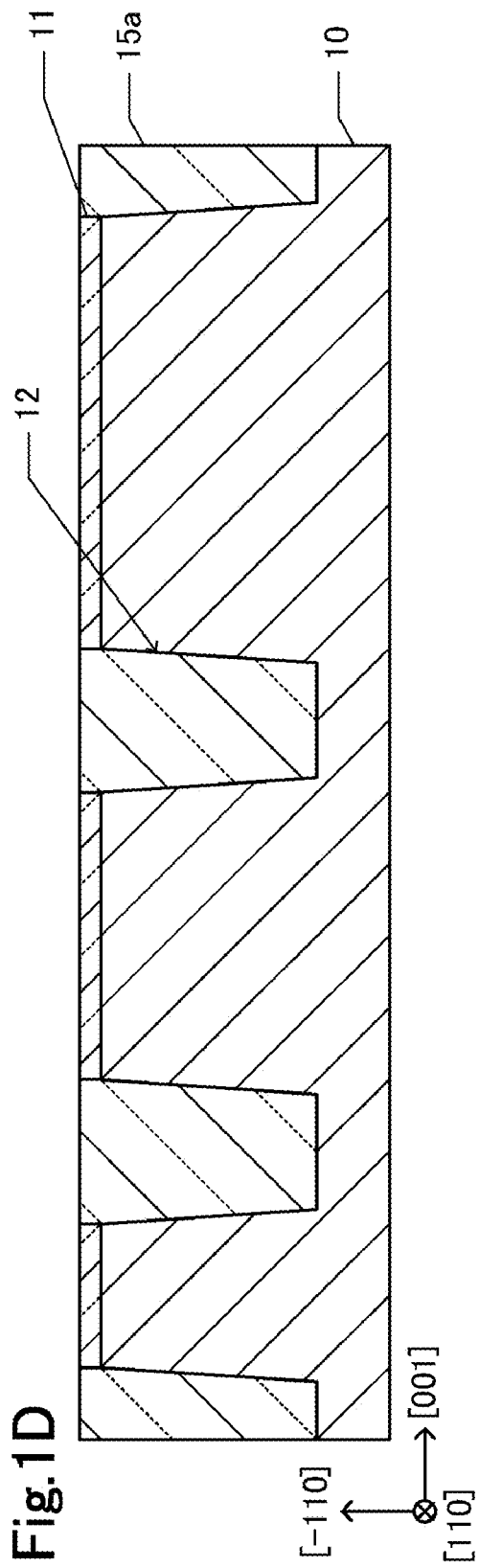

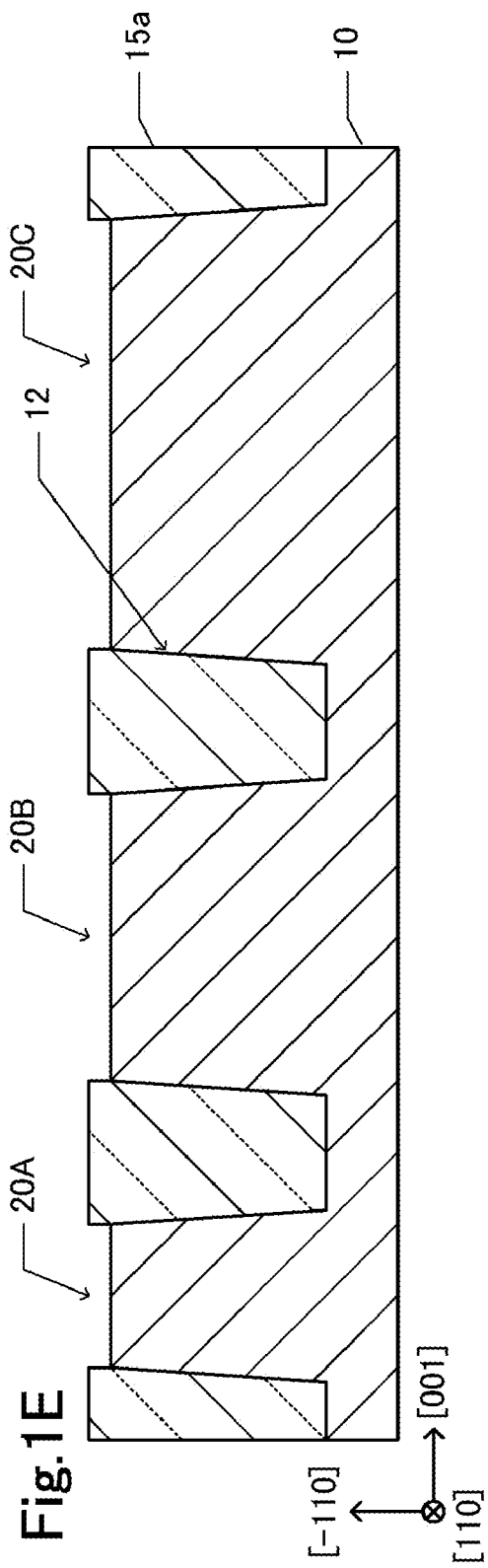
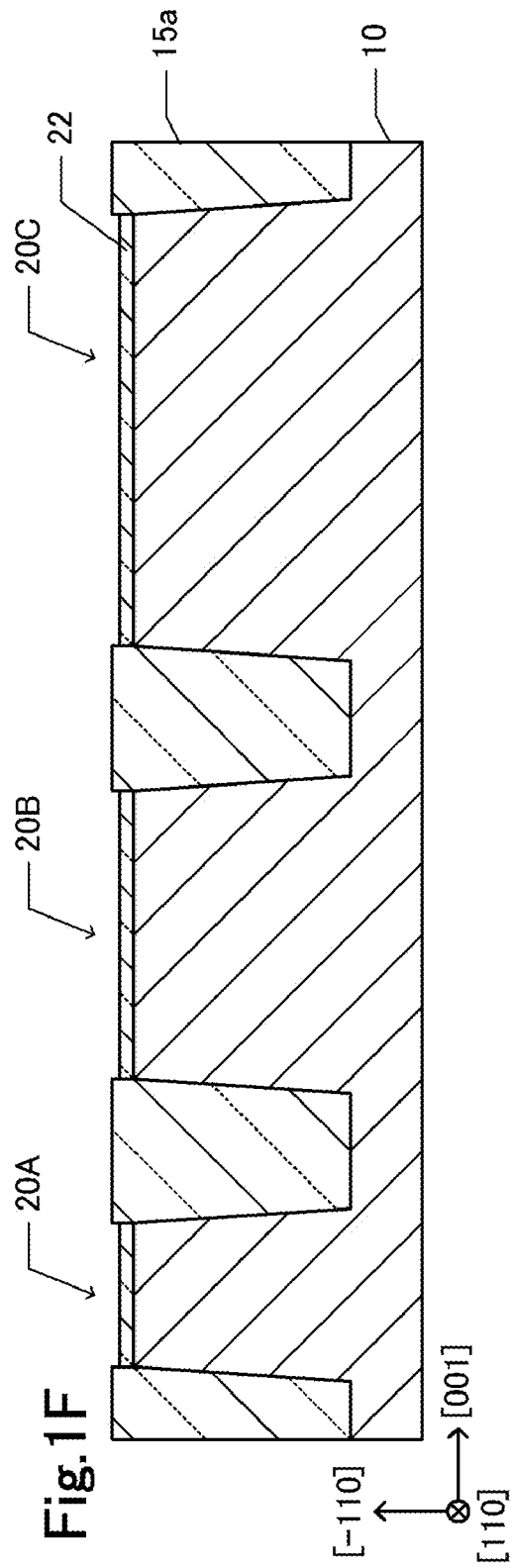

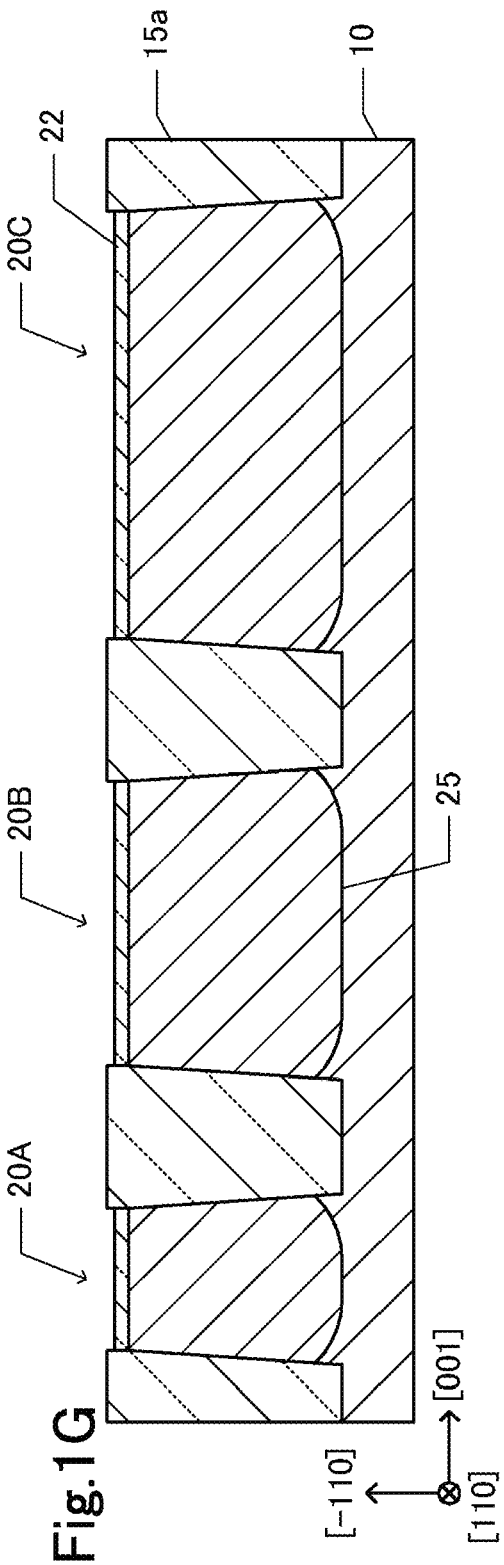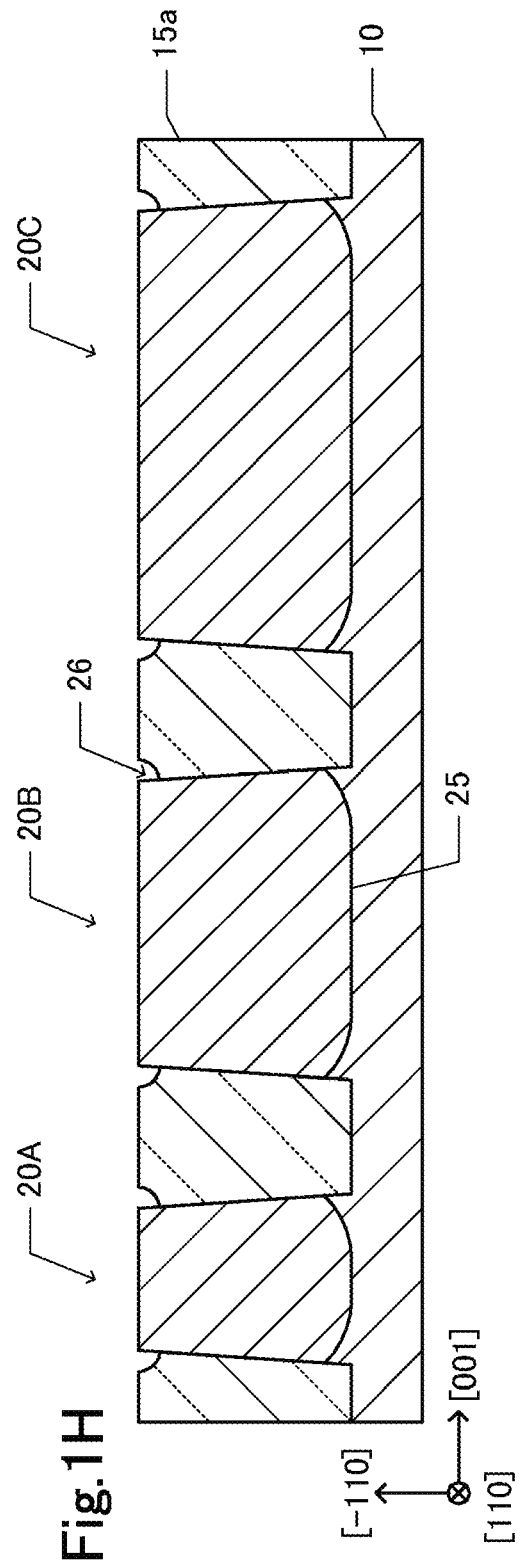

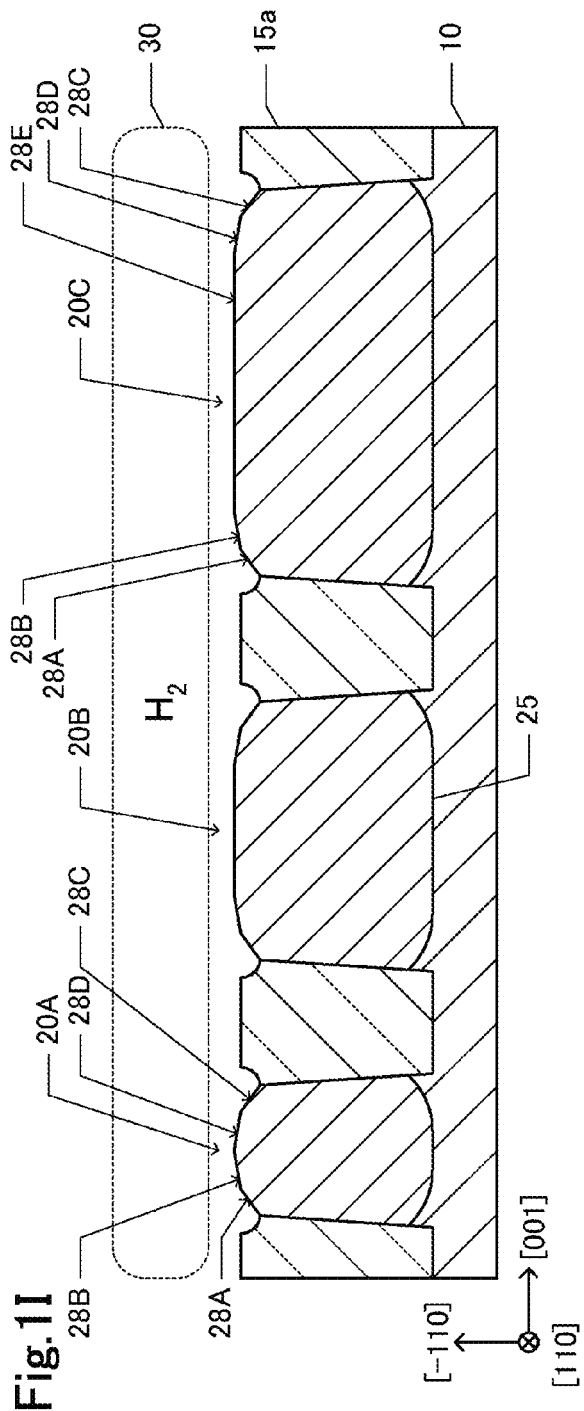
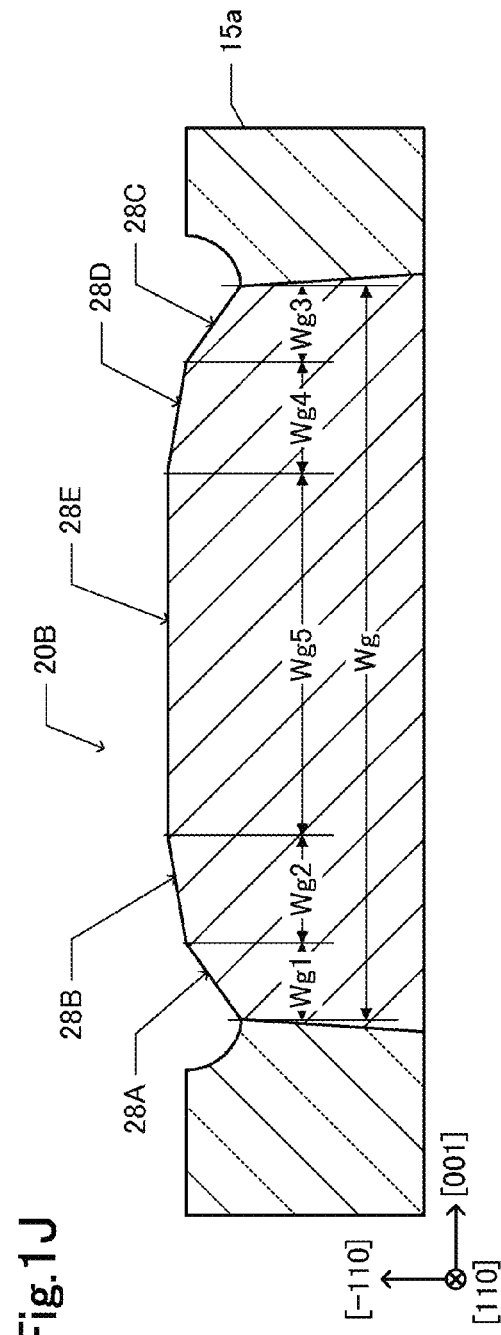

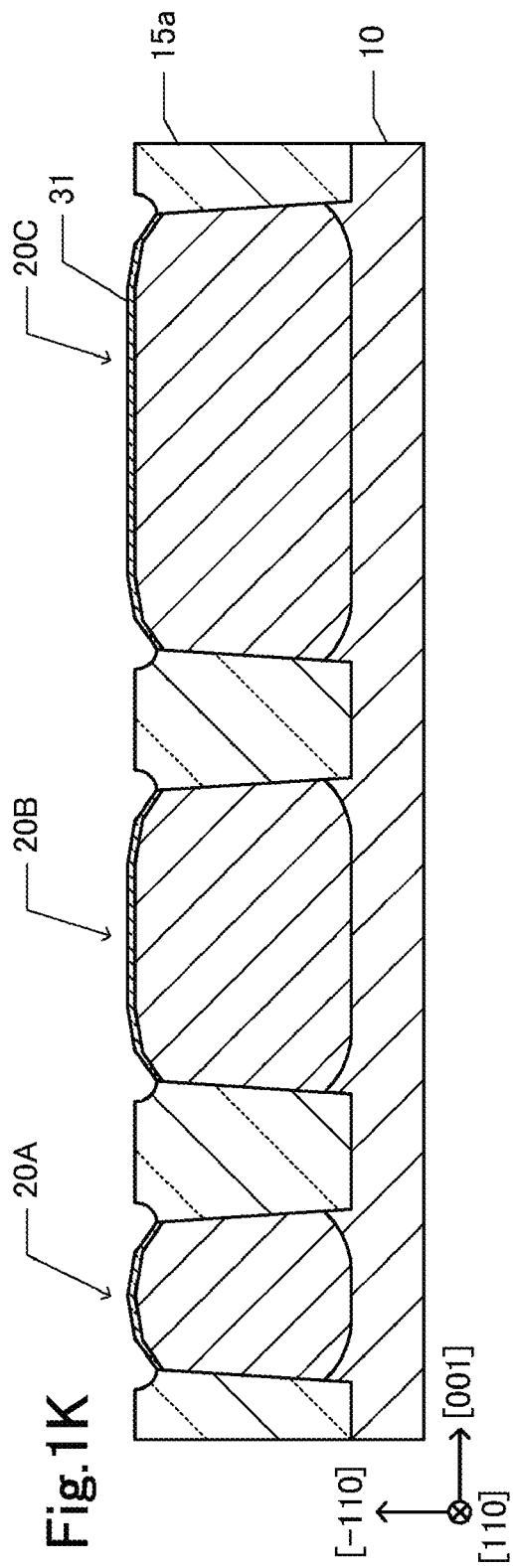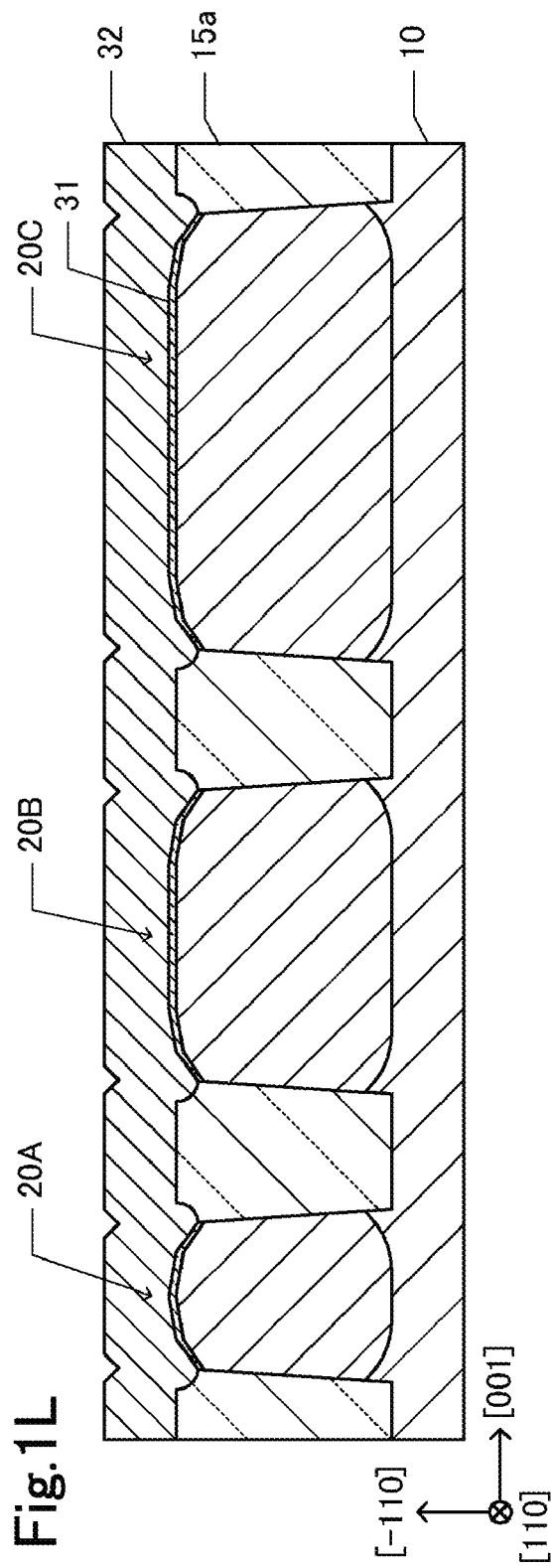

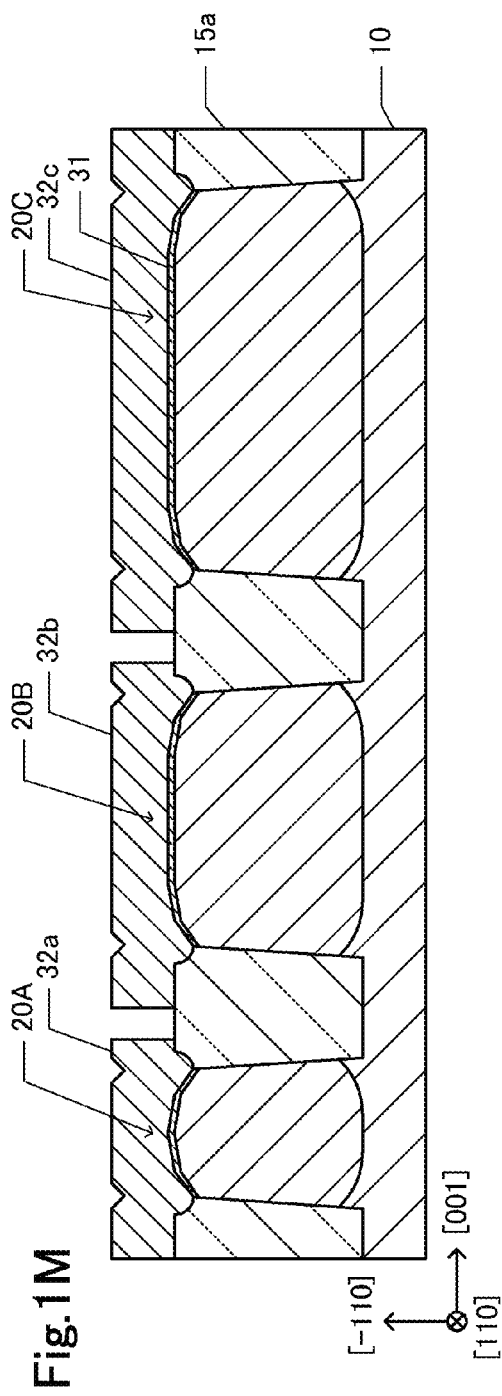
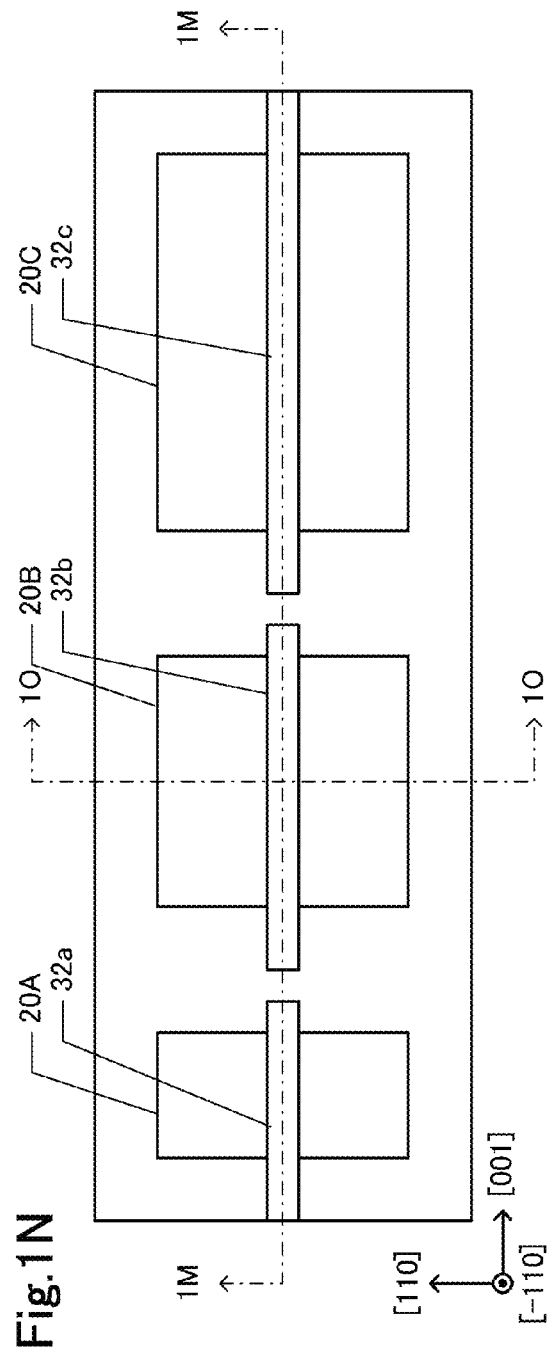

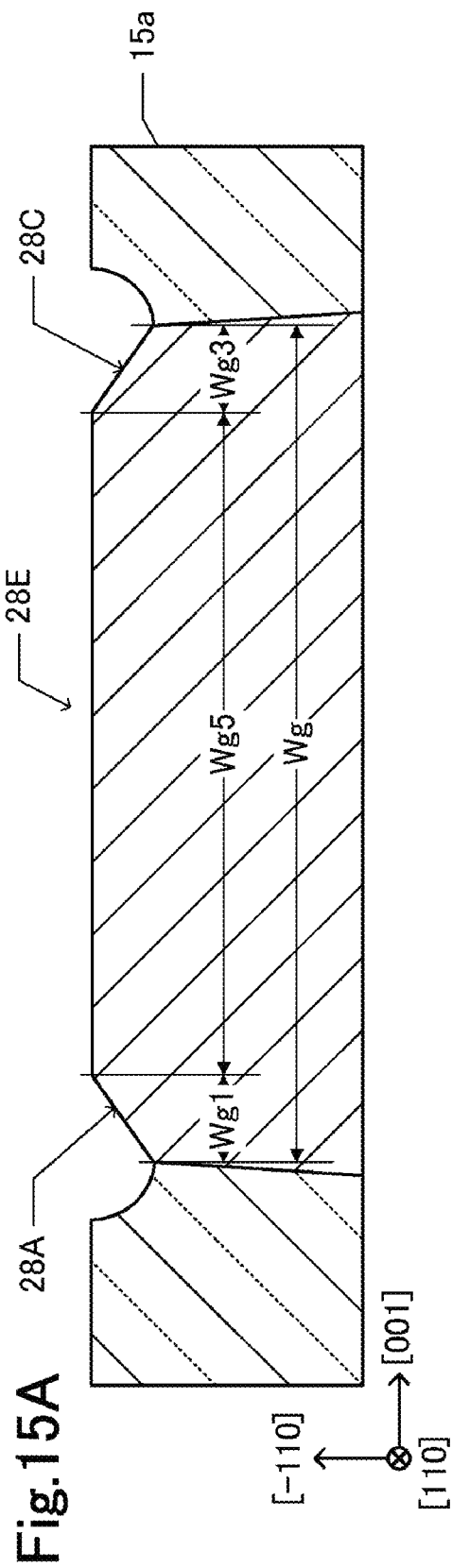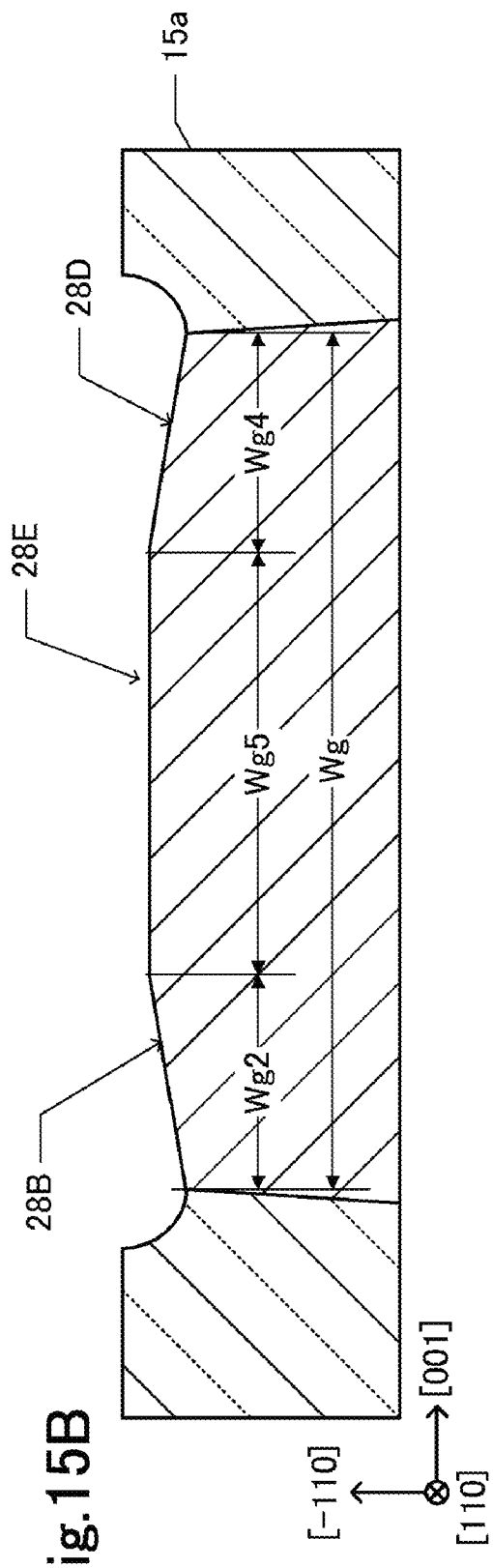

SEMICONDUCTOR DEVICE INCLUDING MISFET AND ITS MANUFACTURE METHOD

This application is based upon and claims the benefit of priority of the prior International Application No. PCT/JP2008/001653, filed on Jun. 25, 2008, the entire contents of which are incorporated herein by reference.

FIELD

The embodiments discussed herein are related to a semiconductor device including a metal/insulator/metal structure field effect transistor (MISFET) using Si or SiGe as a channel and its manufacture method.

BACKGROUND

A channel mobility of a p-type MISFET formed on a substrate having a (110) plane of silicon as its principal surface is higher than a channel mobility of a p-type MISFET formed on a substrate having a (100) plane as its principal surface. In this specification, a substrate having (abc) plane as its principal surface is described in a notation of "(abc) substrate". Paying attention to the characteristics of a p-type MISFET, it is more preferable to use a (110) substrate than a (100) substrate. However, as the (110) substrate is used, a channel mobility of an n-type MISFET lowers.

It is preferable that an n-type MISFET is formed on a (100) plane of a substrate and a p-type MISFET is formed on a (110) plane of the substrate. Studies have been made on a method of forming both a (100) plane and a (110) plane on the surface of a substrate (Document 1). With this method, a (100) Si substrate is bonded to a (110) Si substrate, and solid-phase epitaxial growth is performed in a partial region from the (100) Si substrate toward the (110) Si substrate. A solid-phase epitaxial grown region inherits crystallinity of the underlying substrate so that the surface of this region is the (100) plane. The surface of a region not subjected to solid-phase epitaxial growth remains the (110) plane.

If an n-type MISFET is disposed in a region exposing the (100) plane and a p-type MISFET is disposed in a region exposing the (110) plane, both the n-type MISFET and p-type MISFET may realize good characteristics.

(Document 1) Chun-Yung Sung et al., "High Performance CMOS Bulk Technology Using Direct Silicon Bond (DSB) Mixed Crystal Orientation Substrates", Electron Devices Meeting, 2005, IEDM Technical Digest, IEEE International, pp. 225-228

SUMMARY

According to an aspect of the invention, there is provided a semiconductor device including:
  a substrate including an active region made of Si or SiGe formed in a surface part of the substrate;
  a gate electrode disposed over the active region, a gate insulating film disposed between the gate electrode and the substrate; and
  a source and a drain formed in the surface part of the substrate on sides of the gate electrode,
  wherein a surface of the active region under the gate electrode includes a slope surface being upward from a border of the active region toward an inner side of the active region, and the slope surface has a crystal plane equivalent to (331).

According to another aspect of the invention, there is provided a method for manufacturing a semiconductor device including:
  preparing a substrate exposing a crystal plane equivalent to (110) of Si or SiGe on an active region;
  annealing the substrate in a hydrogen or rare gas atmosphere to migrate Si atoms or Ge atoms in a surface part of the active region and to form a slope surface constituted of a crystal plane equivalent to (111) or a crystal plane equivalent to (331) in at least a partial surface area of the active region; and
  after the annealing, forming a MISFET having a channel which comprises a surface part of the active region just under the slope surface.

According to still another aspect of the invention, there is provided a semiconductor device including:
  a substrate defining an active region on a surface thereof;
  a gate electrode disposed over the active region, a gate insulating film disposed between the gate electrode and the substrate; and
  a source and a drain formed in a surface part of the substrate on sides of the gate electrode,
  wherein a surface of the active region under the gate electrode comprises a crystal plane equivalent to (111) and a crystal plane equivalent to (331).

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Figure 11:
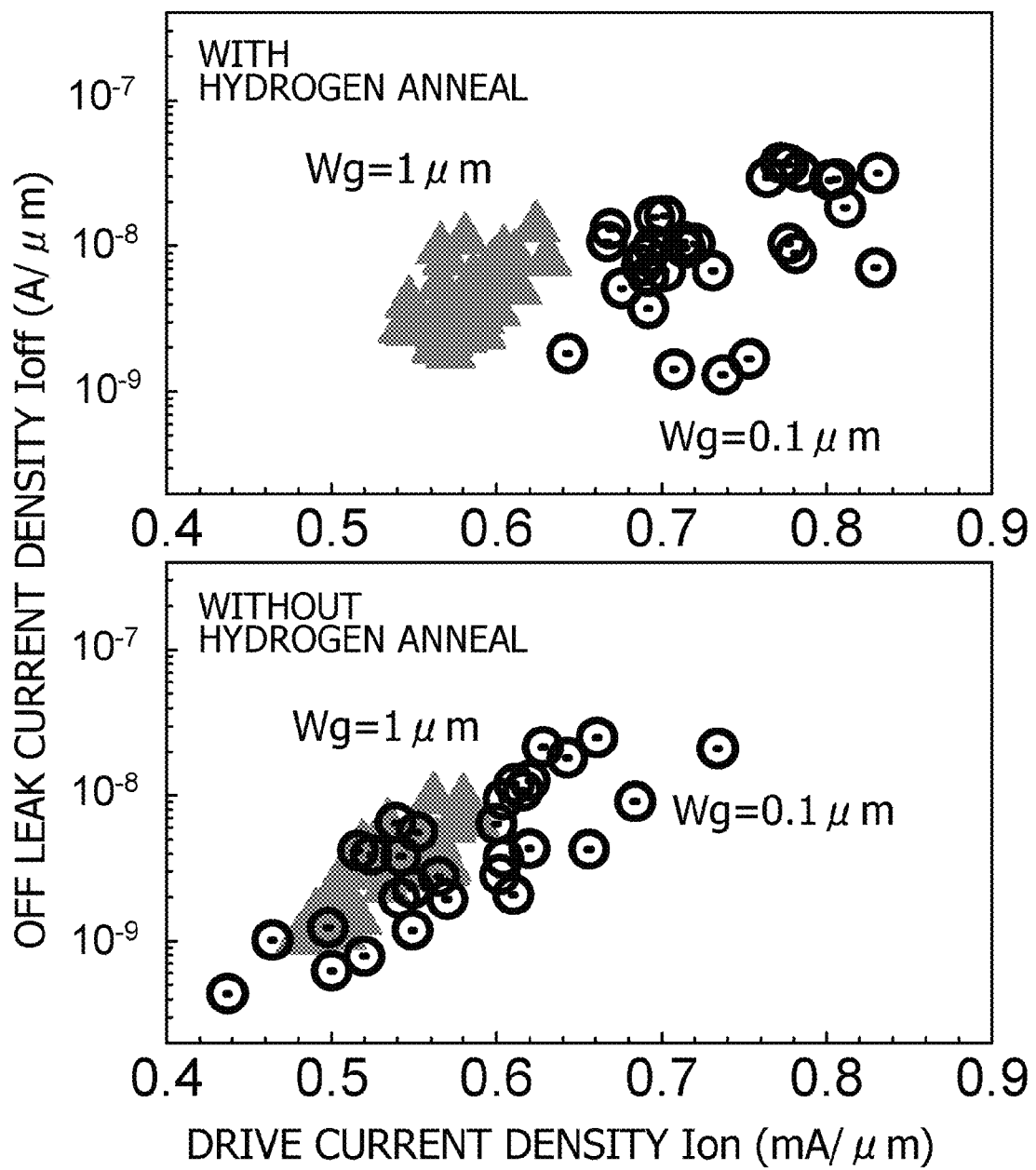

An upper graph in FIG. 11 illustrates measured results of the on/off current characteristics of an n-type MISFET of an embodiment, and a lower graph illustrates measured results of the on/off current characteristics of an n-type MISFET formed on a (110) substrate without hydrogen anneal.

Figure 12:
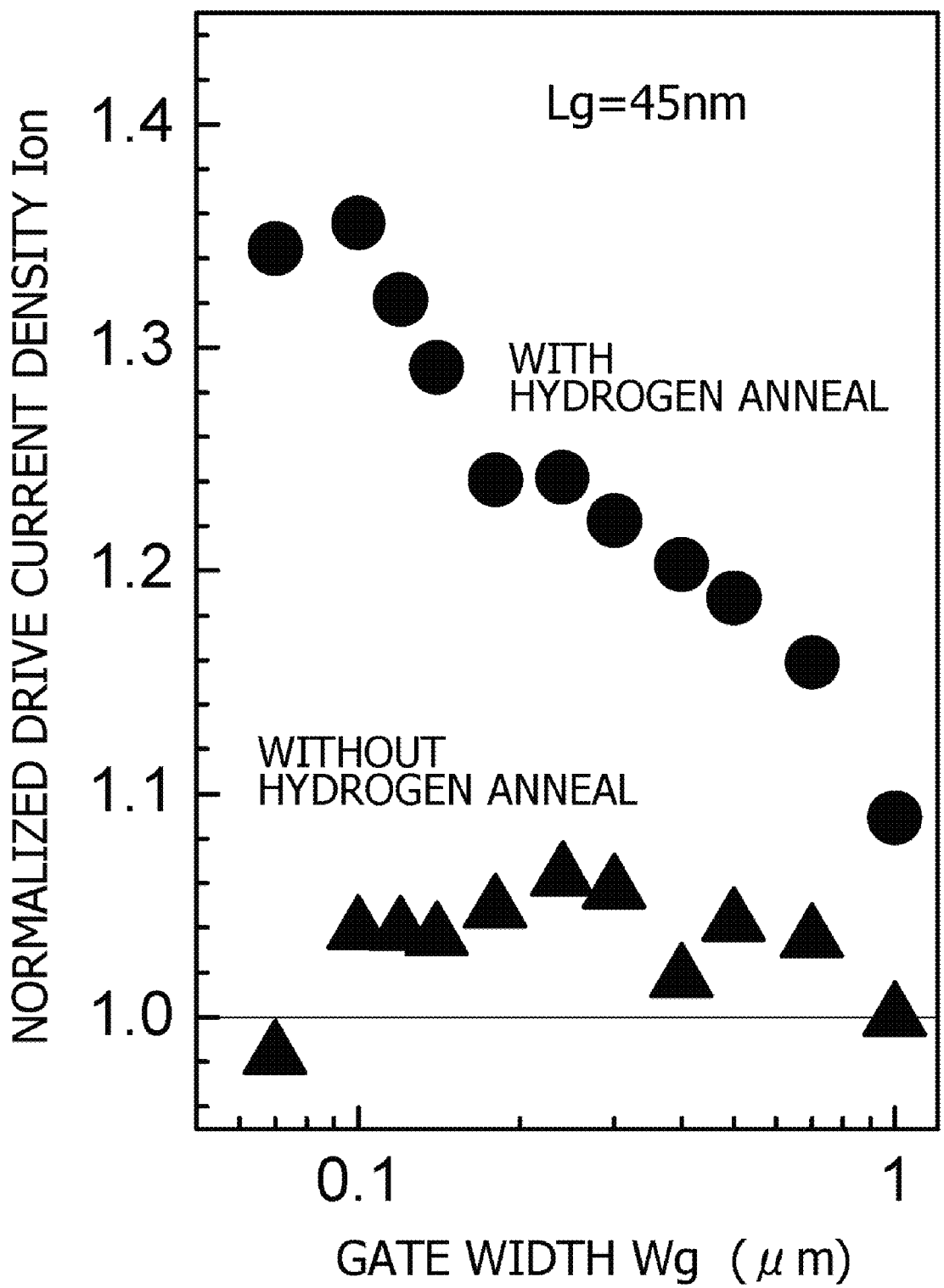

FIG. 12 is a graph illustrating a relation between a gate width and a drive current density of an n-type MISFET of an embodiment and an n-type MISFET formed on a (110) substrate without hydrogen anneal.

Figure 13A:
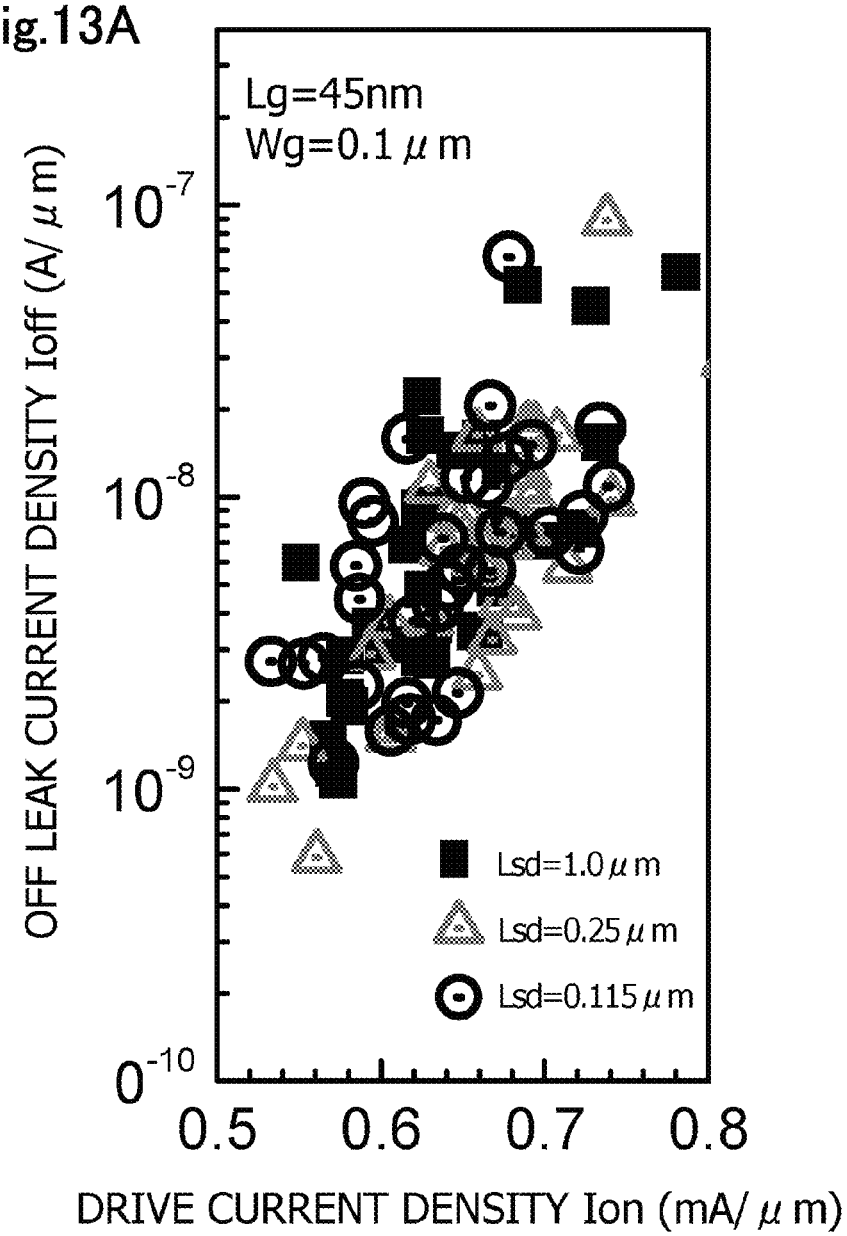
Figure 13B:
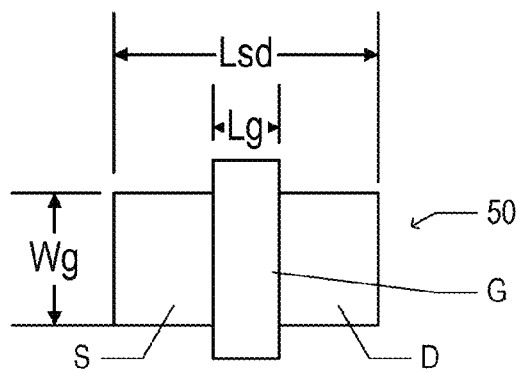

FIG. 13A is a graph illustrating measured results of the on/off current characteristics of an n-type MISFET of an embodiment, and FIG. 13B is a plan view of a measured target MISFET.

Figure 14:
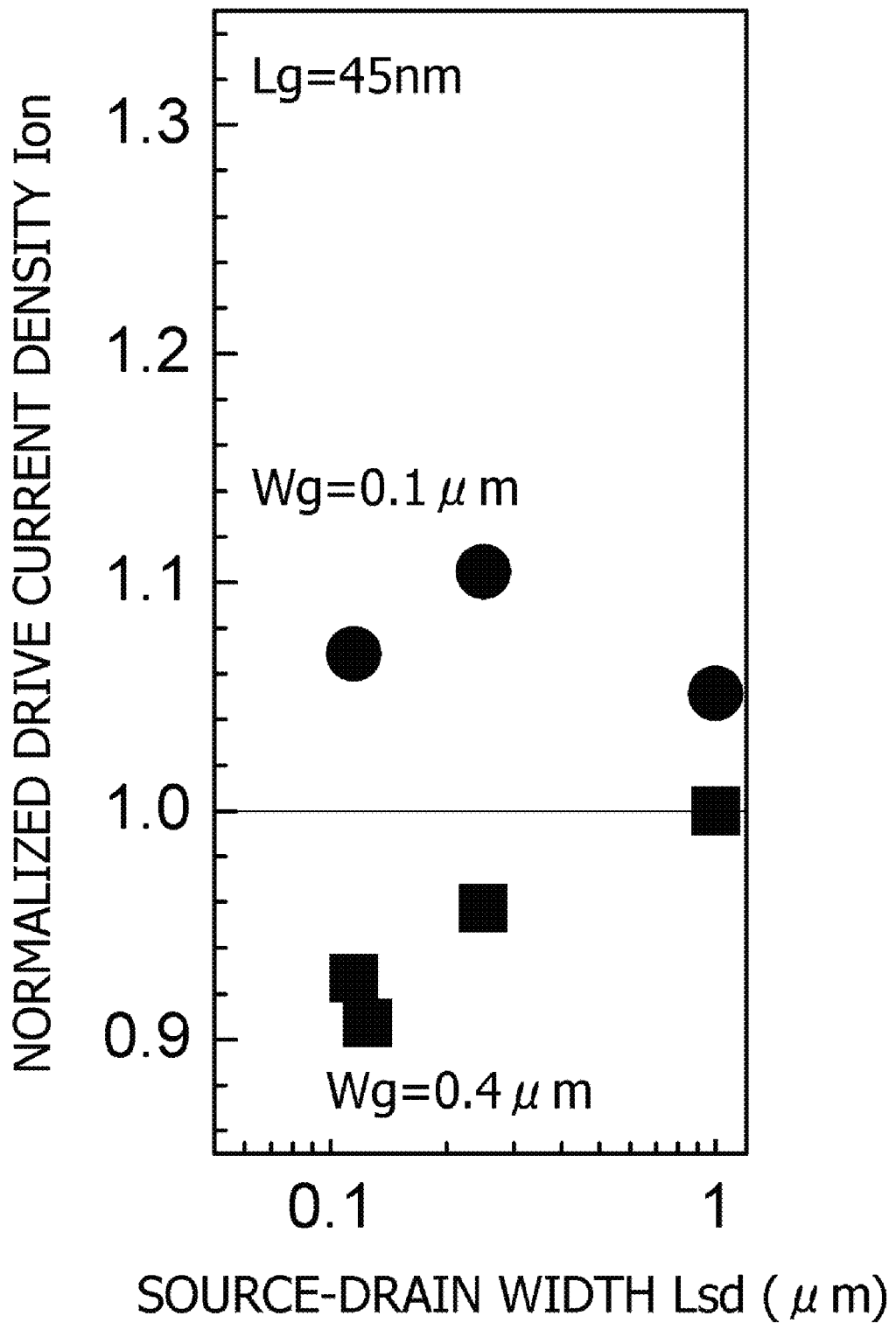

FIG. 14 is a graph illustrating a relation between a source-drain width and a drive current density of an n-type MISFET of an embodiment.

FIGS. 15A and 15B are cross sectional views illustrating a semiconductor device according to a modification of the embodiment during manufacture.

DESCRIPTION OF EMBODIMENTS

A conventional method requires a process of bonding Si substrates. Further, one of an n-type MISFET and a p-type MOSFET is formed in a semiconductor region formed by solid-phase epitaxial growth. The semiconductor region formed by solid-phase epitaxial growth has a crystal quality inferior to that of an initial single crystal substrate. It is therefore difficult to obtain characteristics equivalent to those of a MISFET formed on a single crystal substrate.

A manufacture method for a semiconductor device of an embodiment will be described with reference to FIGS. 1A to 1P.

FIG. 1A is a plan view illustrating a portion of a semiconductor substrate 10 made of silicon. FIG. 1B is a cross sectional view taken along one-dot chain line 1B-1B in FIG. 1A. The principal surface of the semiconductor substrate is constituted of a crystal plane equivalent to (110) of silicon. In FIGS. 1A and 1B, a normal direction of the principal surface is represented by [−110] direction. "−1" means an over bar of a Mirror index 1. A [001] direction and a direction are directions perpendicular to each other on the principal surface.

A hard mask 11 of SiN or the like is formed on the surface of the semiconductor substrate 10. A thickness of the hard mask 11 is, e.g., 100 nm. The hard mask 11 has a plurality of isolated patterns, and covers active regions 20A to 20C. Each pattern of the hard mask 11, i.e., each of the active regions 20A to 20C, has a pair of borders parallel to the [110] direction. In the embodiment, a plan shape of each of the active regions 20A to 20C is a rectangle having sides parallel to the [110] direction. The size of the active region 20B in the [001] direction is longer than that of the active region 20A, and the size of the active region 20C in the [001] direction is longer than that of the active region 20B. By using the hard mask 11 as an etching mask, the surface part of the semiconductor substrate 10 is etched to form a shallow trench 12.

As illustrated in FIG. 1C, an insulating film 15 of silicon oxide is formed on the semiconductor substrate 10, for example, by chemical vapor deposition (CVD) using high density plasma. The shallow trench 12 is filled with the insulating film 15. The inner surface of the shallow trench 12 may be thermally oxidized before the insulating film 15 is formed.

As illustrated in FIG. 1D, the insulating film 15 is removed by chemical mechanical polishing (CMP) until the hard mask 11 is exposed. In the CMP process, the hard mask 11 is used as a polishing stopper film. An element isolation insulating film 15a of silicon oxide is left in the shallow trench 12. At this time, a level of an upper surface of the element isolation insulating film 15a is approximately equal to a level of an upper surface of the hard mask 11. After CMP, the hard mask 11 is removed.

As illustrated in FIG. 1E, silicon is therefore exposed in the active regions 20A to 20C. The exposed silicon surface is lower than the upper surface of the element isolation insulating film 15a by an amount corresponding to a thickness of the hard mask 11.

As illustrated in FIG. 1F, the surfaces of the active regions 20A to 20C are thermally oxidized to form sacrificial oxide films 22. A thickness of the sacrificial oxide film 22 is, e.g., 10 nm.

As illustrated in FIG. 1G, p-type dopants are implanted into the surface regions of the active regions 20A to 20C where n-type MISFET's are to be formed, to form p-type wells 25. If necessary, channel doping is performed to control a threshold value of each MISFET. Surface regions of other active regions where p-type MISFET's are to be formed, are implanted with n-type dopants to form n-type wells. In the state that the sacrificial films 22 are left, anneal is performed to activate dopants.

As illustrated in FIG. 1H, the sacrificial films 22 are removed by using dilute hydrofluoric acid. At this time, the surface region of the element isolation insulating film 15a is also etched. At the borders between the active regions 20A to 20C and the element isolation insulating film 15a, the element isolation insulating film 15a is likely to be etched excessively. Steps 26 are therefore formed at the borders between the active regions 20A to 20C and the element isolation insulating film 15a, and the upper surfaces of the active regions 20A to 20C are higher than the upper surface of the element isolation insulating film 15a. As etching by dilute hydrofluoric acid is continued further after the sacrificial oxide films 22 are removed, the steps 26 become higher. A height of the step 26 may be controlled by an etching time with dilute hydrofluoric acid.

As the steps 26 become high, focus error is likely to occur at a subsequent photolithography process. The height of the step 26 is therefore preferable to be equal to or lower than 30 nm.

As illustrated in FIG. 1I. in the state that the silicon surfaces are exposed in the active regions 20A to 20C, heat treatment is performed in a hydrogen atmosphere 30. This heat treatment is herein called "hydrogen anneal". A heat treatment temperature is set to a temperature allowing Si atoms to migrate on the surfaces of the active regions 20A to 20C, e.g., equal to or higher than 700° C. If the heat treatment temperature is set too high, Si atoms are likely to be desorbed from the silicon surface. In order to prevent Si atoms from being desorbed, it is preferable to set the heat treatment temperature equal to or lower than 1050° C. In order to suppress re-diffusion of dopants, time of the hydrogen anneal is preferably set equal to or shorter than 60 seconds.

As Si atoms migrate on the surfaces of the active regions 20A to 20C, a crystal plane equivalent to (111) of silicon crystal and a crystal plan equivalent to (331) of silicon crystal appear in a region close to the borders of the active regions 20A to 20C.

FIG. 1J is an enlarged cross sectional view illustrating only the active region 20B. A slope surface is formed, the slope surface being upward from one border parallel to the [110] direction toward the inner side of the active region. This slope surface includes a first slope surface 28A contacting a boundary between the active region 20B and the element isolation insulating film 15a and a second slope surface 28B continuous with the first slope surface 28A and disposed between the first slope surface 28A and the central part the active region 20B. The first slope surface 28A is formed by a crystal plane equivalent to (111) of silicon crystal and the second slope surface 28B is formed by a crystal plane equivalent to (331) of silicon crystal. An inclination angle of the first slope surface 28A is about 35° and an inclination angle of the second slope surface 28B is about 13°.

In the same manner, a third slope surface 28C having a crystal plane equivalent to (111) and a fourth slope surface 28D having a crystal plan equivalent to (331) appear in a region close to the other border of the active region 20B parallel to the [110] direction. A level surface 28E having a crystal plane equivalent to (110) is formed in an area inner than the second slope surface 28B and the fourth slope surface 28D.

Figure 2A:
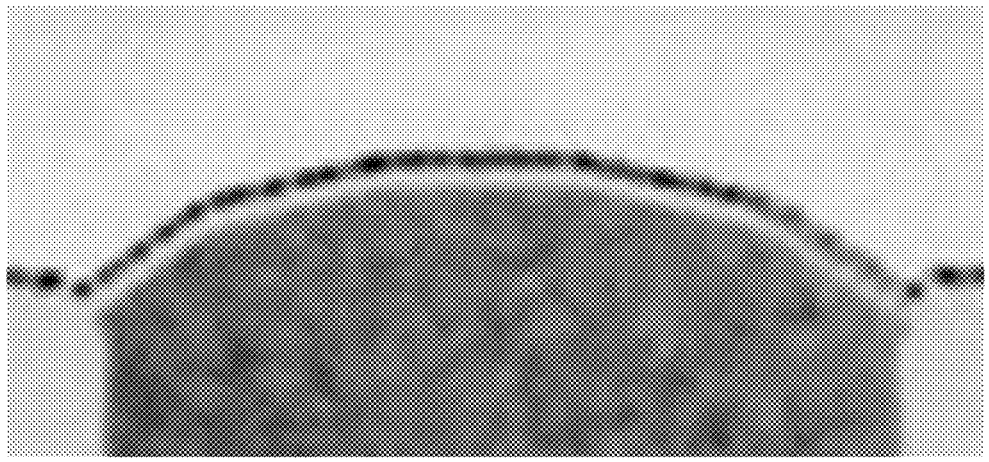
FIGS. 2A and 2B are TEM photographs illustrating cross sectional views of an active region after hydrogen anneal and before hydrogen anneal, respectively.
Figure 2B:
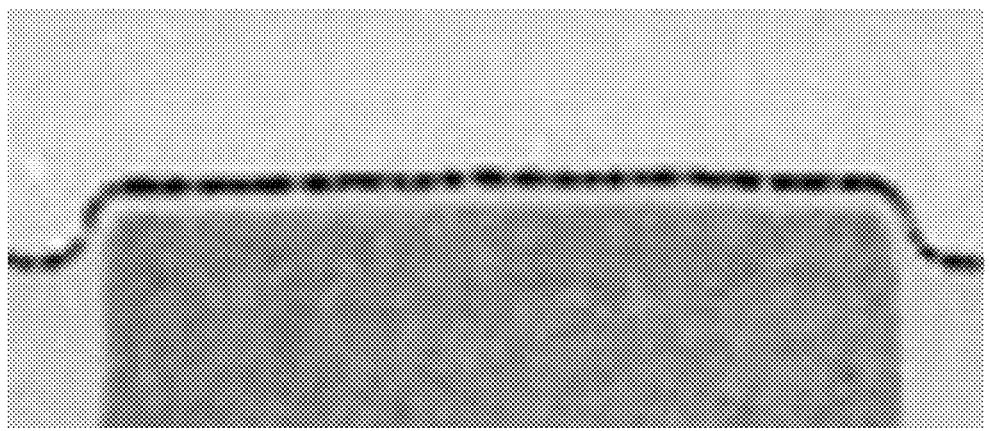

FIG. 2A is a transmission electron microscope (TEM) photograph illustrating a substrate cross sectional view after heat treatment, and FIG. 2B illustrates a TEM photograph before heat treatment. In FIGS. 2A and 2B, the portions near opposite ends of each photograph indicate the element isolation insulating film, and the central portions indicate the active region. It is understood that although the surface of the active region is generally flat before heat treatment, slope surfaces are formed near at the border of the active region by performing heat treatment. It is understood that the slope surface is constituted of two areas having different inclination angles.

As illustrated in FIG. 1J, widths of the first slope surface 28A to fourth slope surface 28D in the [001] direction are represented by Wg1 to Wg4, respectively. A width of the level surface 28E in the [001] direction is represented by Wg5. A width Wg of the active region 20B in the [001] direction is equal to Wg1+Wg2+Wg3+Wg4+Wg5. The width Wg is called "gate width". A ratio of the slope surfaces 28A to 28D to the gate width Wg, namely (Wg1+Wg2+Wg3+Wg4)/Wg, depends on the hydrogen anneal condition and a height of the step 26.

It is considered that as the step 26 becomes high, a slope surface occupying ratio (Wg1+Wg2+Wg3+Wg4)/Wg becomes high. Even if the step 26 is not formed, hydrogen anneal generates Si atom migration, and slope surfaces are formed having crystal planes equivalent to (111) and (331).

As the gate width Wg becomes narrow, the width Wg5 of the level surface 28E becomes narrow. As the gate width Wg becomes narrower, the level surface 28E disappears and the second slope surface 28B contacts the fourth slope surface 28D. In the active region 20A in FIG. 1I, the second slope surface 28B contacts the fourth slope surface 28D, and the level surface disappears. In the active region 20C, a ratio of an area occupied by the level surface 28 E becomes higher.

At a height of the step 26 of 20 nm, hydrogen anneal was performed for 10 seconds at 1000° C. Each of the width Wg1 of the first slope surface 28A and the width Wg3 of the third slope surface 28C was about 20.8 nm, and each of the width Wg2 of the second slope surface 28B and the width Wg4 of the fourth slope surface 28D was about 24 nm.

As illustrated in FIG. 1K, the surfaces of the active regions 20A to 20C are thermally oxidized to form gate insulating films 31. A thickness of the gate insulating film 31 is, e.g., 1.2 nm. The surface of the active region after migration of Si atoms by the hydrogen anneal process illustrated in FIG. 1I is flat at an atomic level. Immediately after migration, thermal oxidation is performed without performing ion implantation and the like. It is therefore possible to form the gate insulating film 31 of high quality.

In addition to silicon oxide, the gate insulating film 31 may be made of SiON, or so-called high dielectric constant (High-K) material such as HfO, HfSiO, HfSiON.

As illustrated in FIG. 1L, a polysilicon film 32 is formed on the gate insulating films 31 and the element isolation insulating film 15a, for example, by CVD. Instead of the polysilicon film 32, a film made of amorphous silicon or conductive material such as metal material may be used.

As illustrated in FIGS. 1M and 1N, the polysilicon film 32 is patterned to form gate electrodes 32a to 32c. FIG. 1N is a plan view of the substrate, and FIG. 1M is a cross sectional view taken along on-dot chain line 1M-1M in FIG. 1N.

The gate electrode 32a intersects with the active region 20A in such a manner that the gate electrode extends from one border to the other border of the active region 20A parallel to the [110] direction. The gate electrodes 32b and 32c intersect the active regions 20B and 20C respectively in such a manner that the gate electrodes extend from one borders to the other borders of the active regions 20B and 20C in the [110] direction.

Figure 1O:
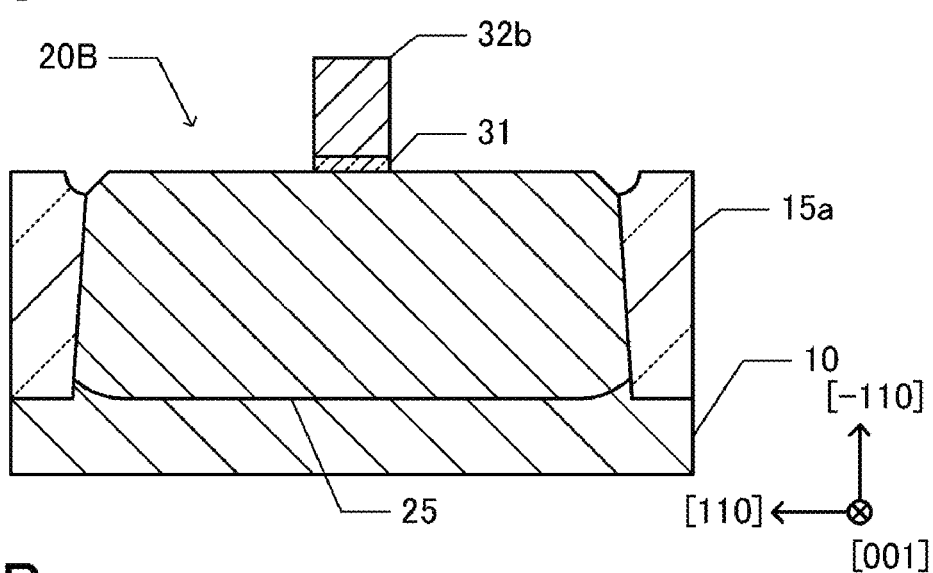
FIGS. 1A to 1P are plane views and cross sectional views illustrating a semiconductor device of an embodiment during manufacture.

FIG. 1O is a cross sectional view taken along one-dot chain line 1O-1O in FIG. 1N. The gate electrode 32b is formed over the active region 20B via the gate insulating film 31. A slope surface constituted of a crystal plane equivalent to (100) appears at the border of the active region 20B parallel to the [001] direction.

Figure 1P:
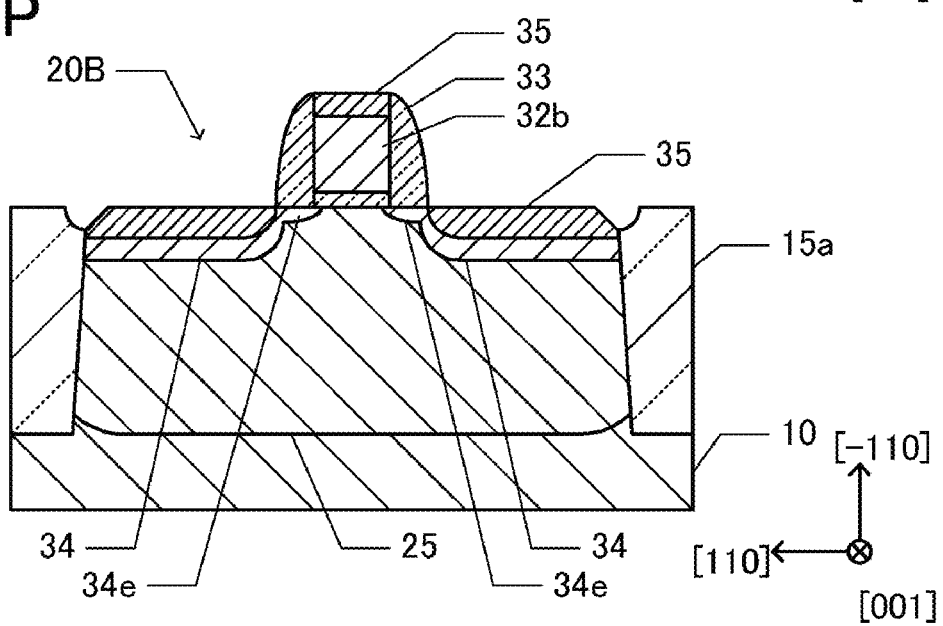

As illustrated in FIG. 1P, extension regions 34e are formed in the surface parts of the active region 20B on both sides of the gate electrode 32b by implanting n-type dopants. Side wall spacers 33 are formed on side walls of the gate electrode 32b. By using the gate electrode 32b and the side wall spacers 33 as a mask, n-type dopants are implanted to form a source and drain 34. A metal silicide film 35 is formed on the upper surfaces of the source and drain 34 and the gate electrode 32b. In this manner, an n-type MISFET is formed.

A p-type MISFET may be formed using the similar manner. It is also possible to form a CMOS circuit. Offset spacers may be formed on both sides of the gate electrode 32b, before the extension regions 34e are formed.

In the MISFET of the embodiment, as illustrated in FIG. 13, the surface of the active region 20B under the gate electrode 32b includes the first slope surface 28A, the second slope surface 28B, the third slope surface 28C, and the fourth slope surface 28D, respectively inclining and being upward from the border of the active region 20B toward the inner side. The surface further includes the central level surface 28E. The channel between the source and drain is formed just under these slope surfaces 28A to 28D and the level surface 28E. A carrier motion direction is parallel to the [110] direction.

In FIG. 13, the gate width Wg is equal to a length of a straight line coupling both ends of the surface of the active region 20B. In a conventional MISFET, an actual gate width is approximately equal to a design gate width. In the embodiment MISFET, the surface of the active region 20B includes slope surfaces, and the channel is formed along and just under the slope surfaces. An effective gate width is therefore wider than a design gate width Wg.

In order to clarify the coordinate system in FIGS. 1A to 1P, the normal direction of the substrate principal surface is represented by [−110] and the carrier motion direction is represented by [110]. However, the [−110] direction and direction are equivalent from the viewpoint of crystallography. The [110] direction and the direction equivalent to the [110] direction is described in a notation of <110>.

A plurality of p- and n-type MISFET's having different gate lengths Lg were manufactured by the embodiment method, and the characteristics were evaluated. For comparison, a plurality of p- and n-type MISFET's having different gate lengths Lg were manufactured by using a general (001) Si substrate. A plurality of n-type MISFET's were manufactured by a conventional method without hydrogen anneal by using the same (110) substrate as the embodiment. Each MISFET has a carrier motion direction (gate length direction) of <110>.

Figure 3:
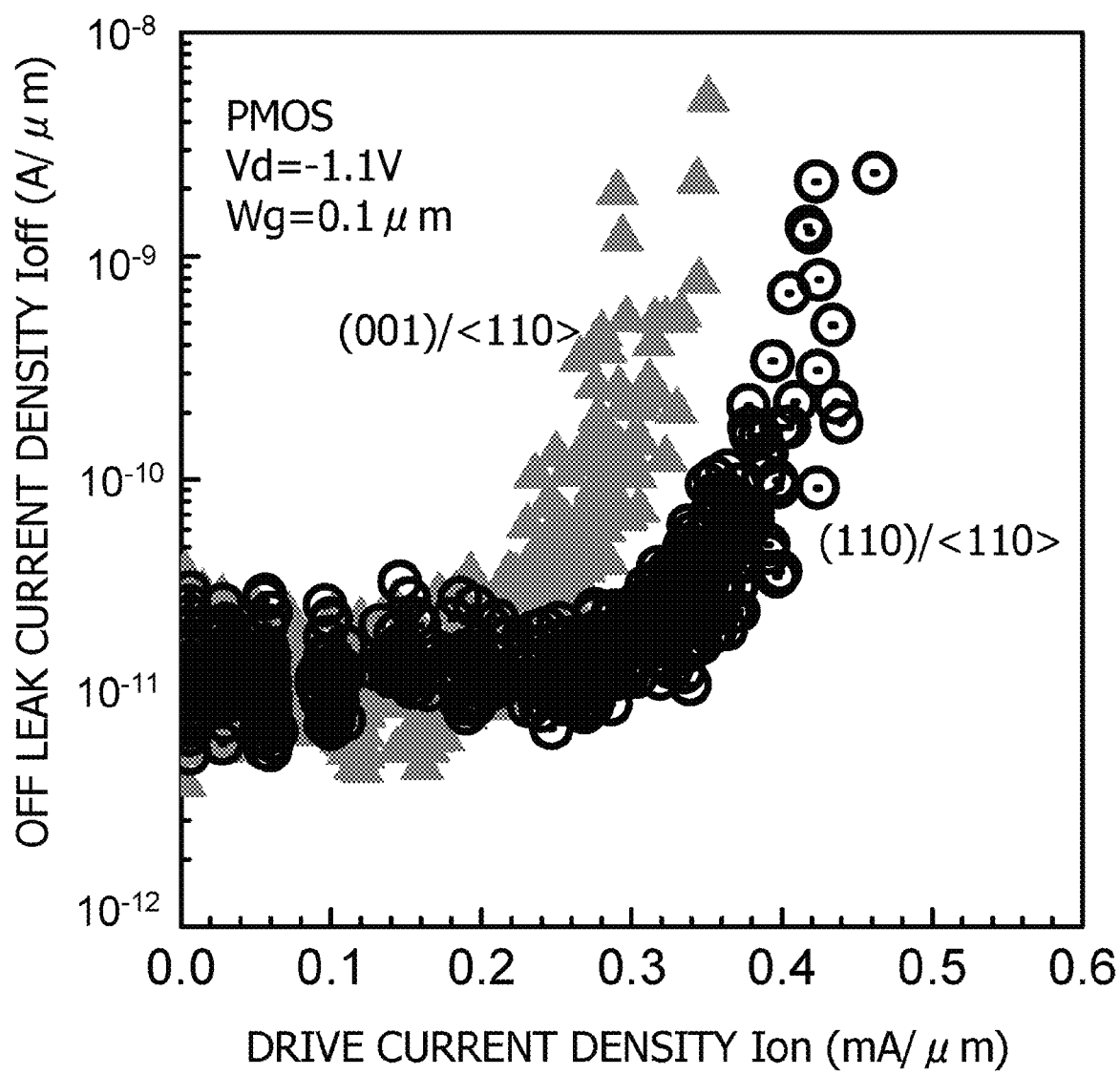
FIG. 3 is a graph illustrating measured results of the on/off current characteristics of a p-type MISFET of an embodiment and a p-type MISFET formed on a (001) substrate.

FIG. 3 illustrates measured results of the on/off current characteristics of p-type MISFET's. The abscissa represents a drive current density Ion in the unit of "mA/µm", and the ordinate represents an off leak current density Ioff in the unit of "A/µm". The drive current density and off leak current density is a drain current density per unit gate width (in this case, 1 µm). Circle with center dot symbols and triangle symbols in FIG. 3 indicate the on/off current characteristics of p-type MISFET's of the embodiment and comparative example, respectively. A gate width Wg was 0.1 µm, and a drain voltage Vd was −1.1 V.

It is understood from comparison between MISFET's having the same off leak current density that a drive current density of a p-type MISFET of the embodiment is considerably larger than a drive current density of a p-type MISFET of the comparative example. The electrical characteristics of the p-type MISFET of the embodiment are better than the electrical characteristics of the p-type MISFET of the comparative example.

Figure 4:
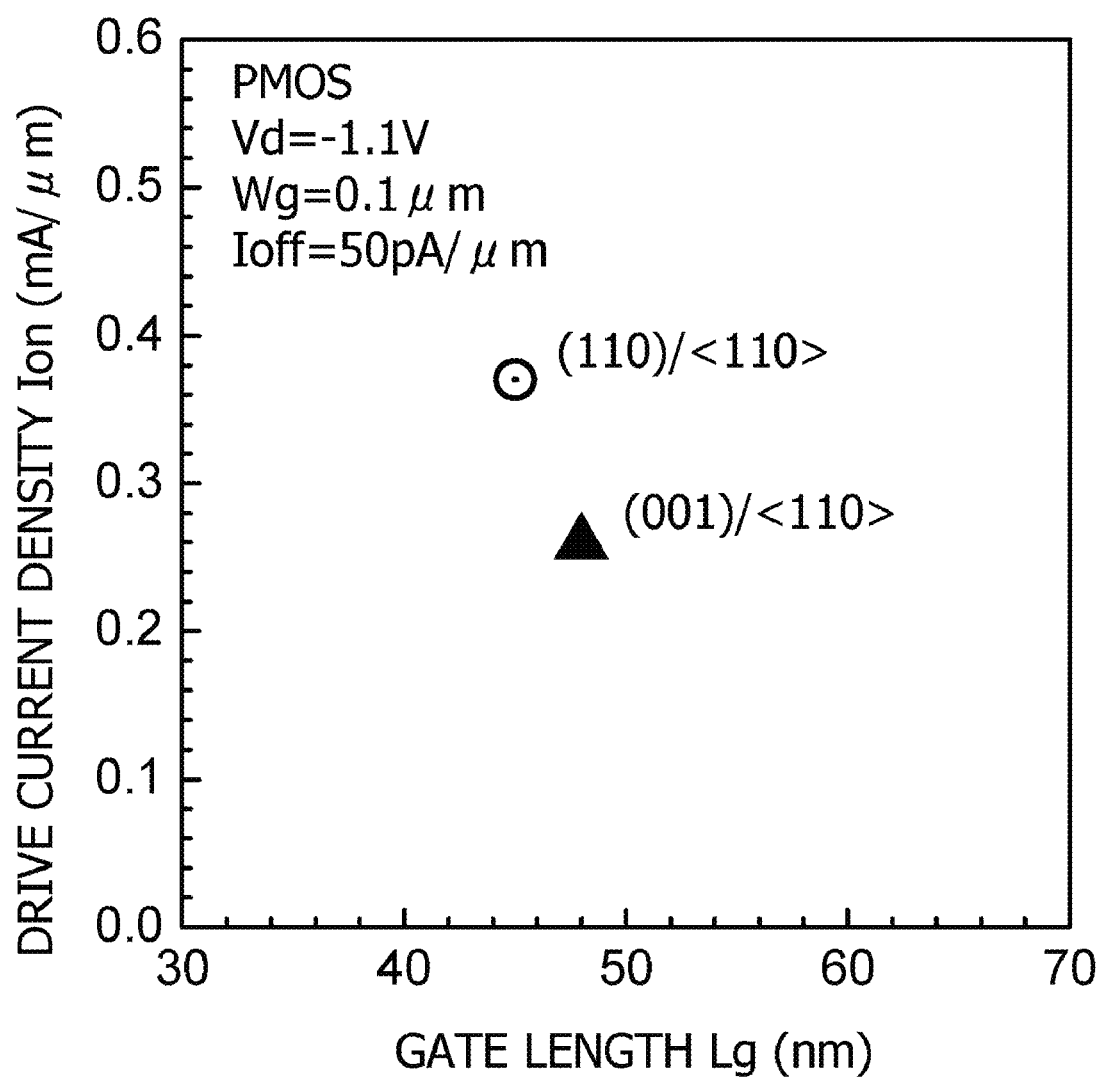
FIG. 4 is a graph illustrating a relation between a gate length and a drive current density of a p-type MISFET of an embodiment and a p-type MISFET formed on a (001) substrate.

FIG. 4 illustrates a relation between a gate length Lg and a drive current density Ion of a p-type MISFET having an off leak current density of 50 pA/µm. The abscissa represents a gate length Lg in the unit of "nm", and the ordinate represents a drive current density Ion in the unit of "mA/µm". Circle with center dot symbols and triangle symbols in FIG. 4 indicate measured results of p-type MISFET's of the embodiment and comparative example, respectively.

The p-type MISFET of the embodiment has a larger drive current density Ion and a shorter gate length Lg than those of the p-type MISFET of the comparative example, under the condition of the same off leak current density. The minimum operation gate length of the p-type MISFET of the embodiment is able to be made shorter more than that of the p-type MISFET using a (001) substrate.

As illustrated in FIGS. 3 and 4, the reasons of improved electrical characteristics of the p-type MISFET of the embodiment are an increase of a channel mobility because of adoption of a (110) substrate and a widening of the effective gate width because a slope substrate surface is formed just under the gate electrode.

Figure 5:
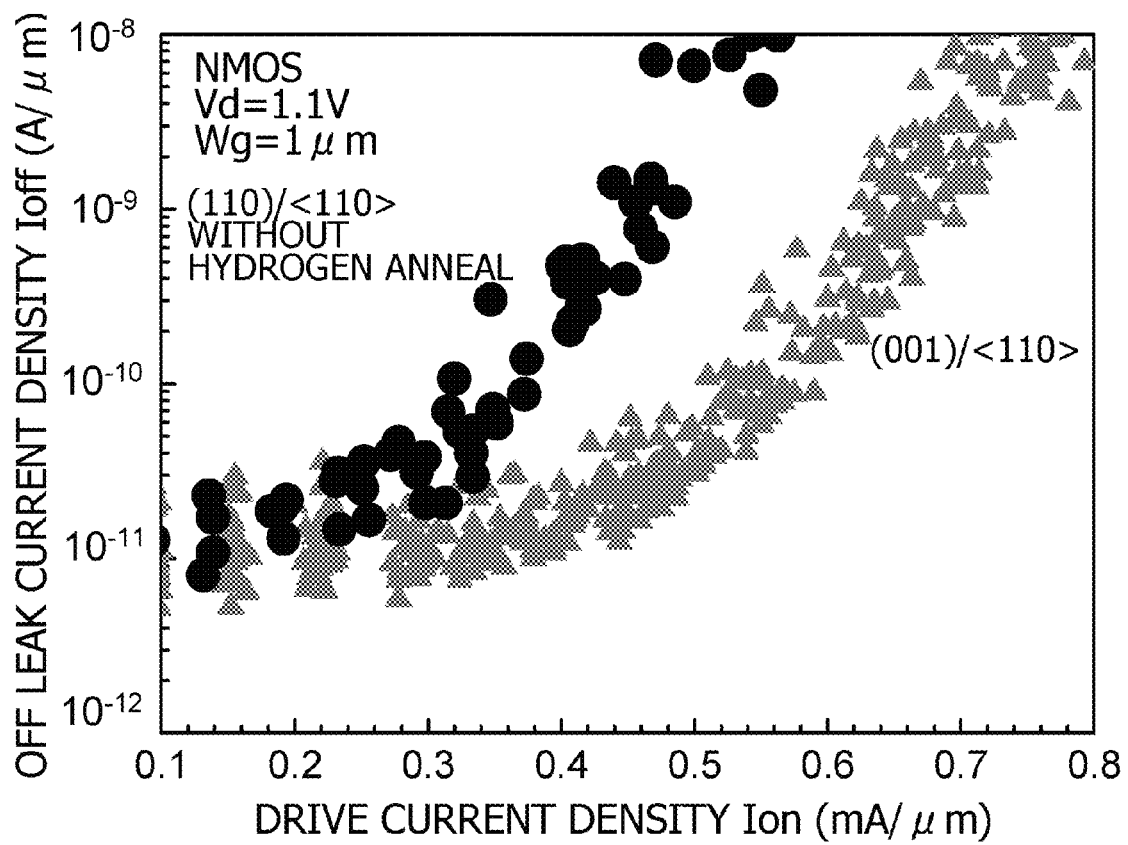
FIG. 5 is a graph illustrating measured results of the on/off current characteristics of an n-type MISFET formed on a (110) substrate without hydrogen anneal and an n-type MISFET formed on a (001) substrate.

FIG. 5 illustrates the characteristics of a conventional n-type MISFET manufactured without the hydrogen anneal using a (001) substrate and a conventional n-type MISFET using a (110) substrate by comparison. A gate width Wg was 1 µm, and a drain voltage Vd was 1.1 V. It is understood that the n-type MISFET manufactured using the (110) substrate without the hydrogen anneal is inferior to that using the (001) substrate in on/off current characteristics.

Figure 6:
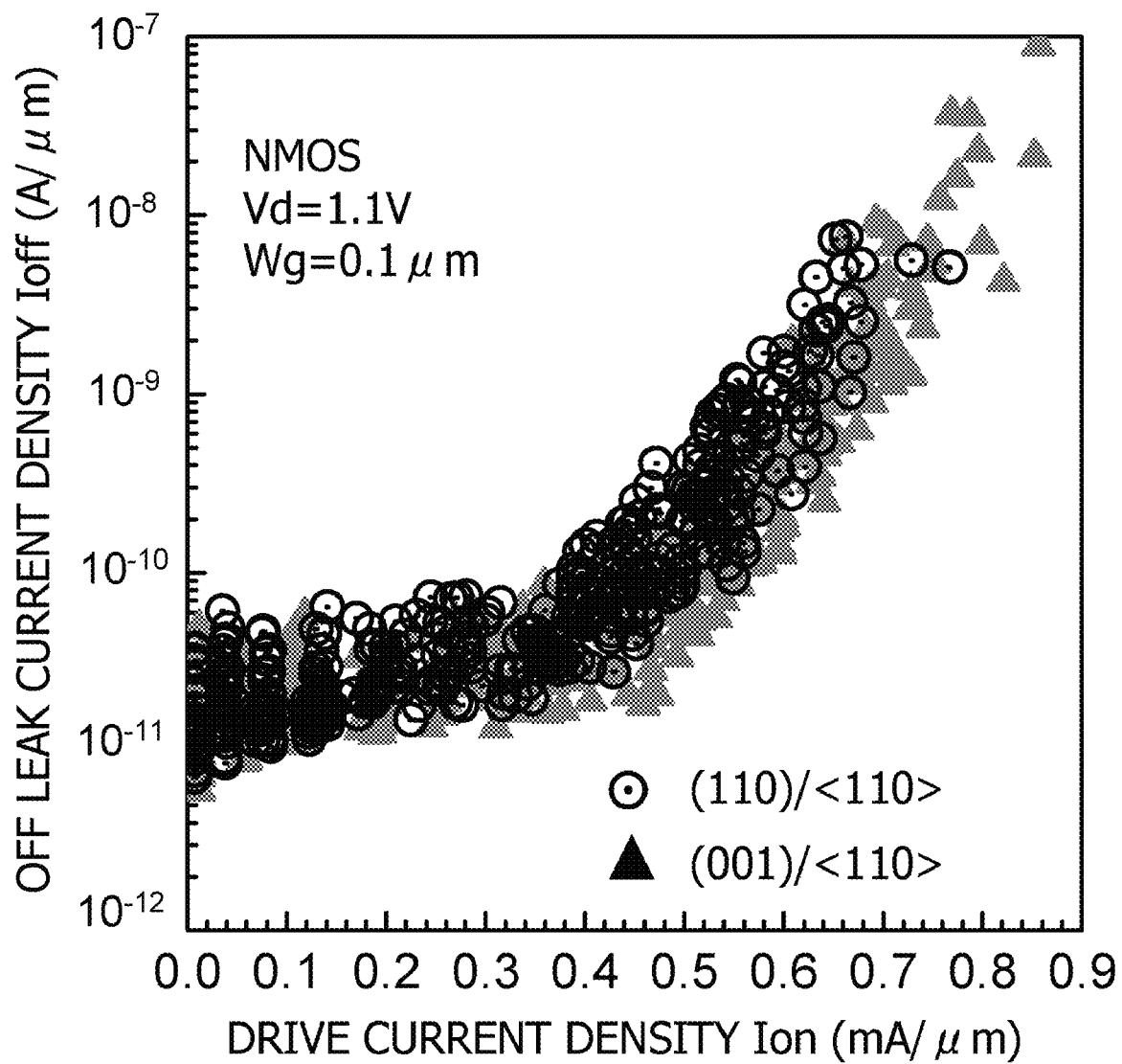
FIG. 6 is a graph illustrating measured results of the on/off current characteristics of an n-type MISFET of an embodiment and an n-type MISFET formed on a (001) substrate.

FIG. 6 illustrates measured results of the on/off characteristics of an n-type MISFET of the embodiment manufactured by performing the hydrogen anneal compared to measured results of an n-type MISFET using a (001) substrate. The abscissa represents a drive current density Ion in the unit of "mA/µm, and the ordinate represents an off leak current density Ioff in the unit of "A/µm". A gate width Wg was 0.1 µm, and a drain voltage Vd was 1.1 V. A threshold voltage was set to a standard voltage of 0.22 V.

It is understood that the n-type MISFET of the embodiment is in no way inferior to the n-type MISFET using a (001) substrate in electrical characteristics.

Although the embodiment uses the (110) substrate, a channel is formed just under the (111) plane and (331) plane as illustrated in FIG. 1J and other figures. An electron mobility is therefore suppressed from being lowered. A drive current density is suppressed from being lowered by a widened effective gate width. By adopting the structure of the embodiment to an n-type MISFET, it becomes possible to obtain the n-type MISFET that is in no way inferior to that using a (001) substrate in the on/off current characteristics.

Figure 7:
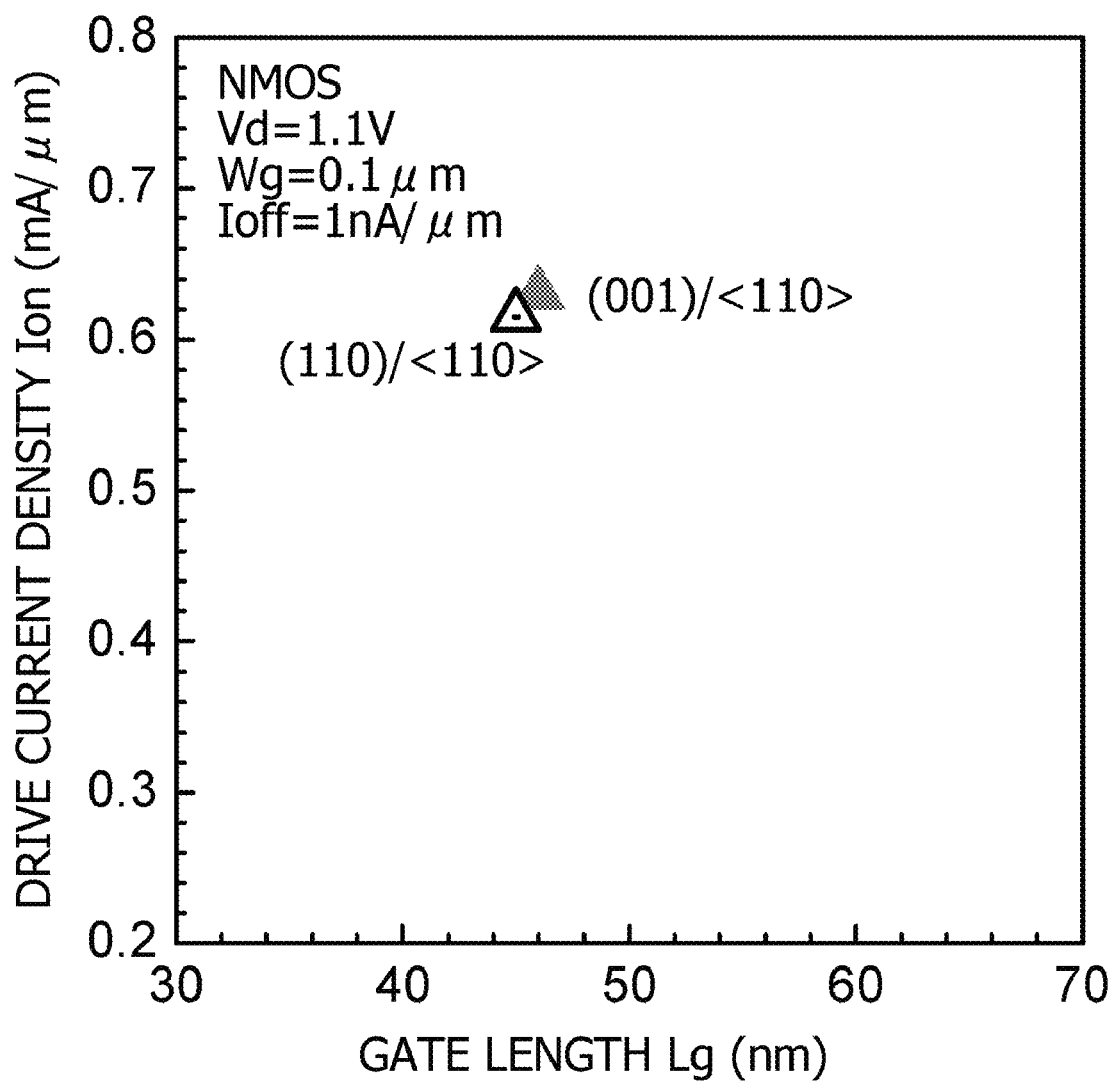
FIG. 7 is a graph illustrating a relation between a gate length and a drive current density of an n-type MISFET of an embodiment and an n-type MISFET formed on a (001) substrate.

FIG. 7 illustrates a relation between a gate length Lg and a drive current density Ion of an n-type MISFET having an off leak current density of 1 nA/µm. The abscissa represents a gate length Lg in the unit of "nm", and the ordinate represents a drive current density Ion in the unit of "mA/µm". Circle with center dot symbols and solid circle symbols in FIG. 7 indicate measured results of n-type MISFET's of the embodiment and comparative example using a (001) substrate, respectively.

Under the condition of the same off leak current density, the gate lengths Lg of the n-type MISFET's of the embodiment and comparative example using the (001) substrate are approximately equal to each other. By adopting the structure of the embodiment, the n-type MISFET using the (110) substrate is in no way inferior to the n-type MISFET of the comparative example using the (001) substrate in a minimum operation gate length.

Figure 8:
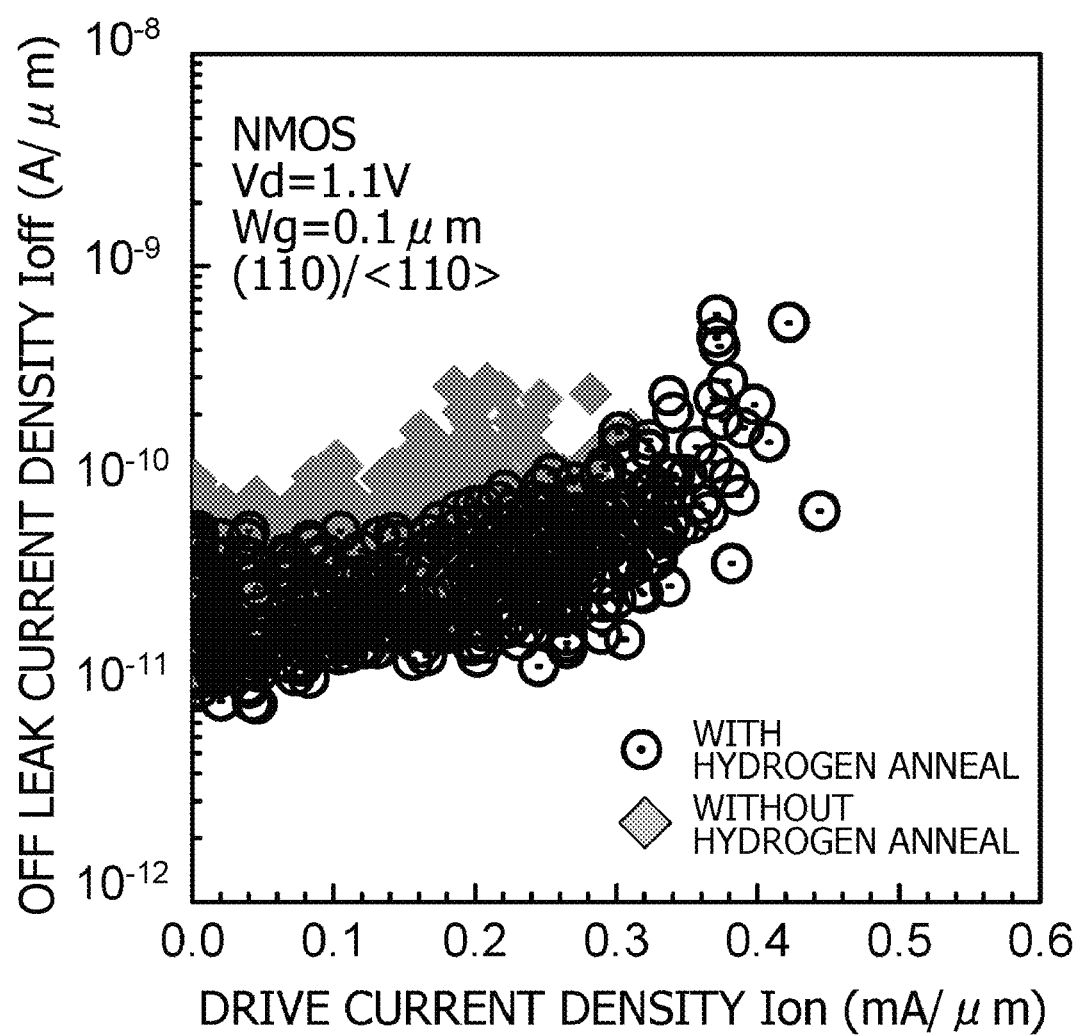
FIG. 8 is a graph illustrating measured results of the on/off current characteristics of an n-type MISFET of an embodiment having a threshold value higher than a standard value and an n-type MISFET formed on a (110) substrate without hydrogen anneal.

FIG. 8 illustrates measured results of the on/off current characteristics of an n-type MISFET of the embodiment, and an n-type MISFET of the comparative example manufactured without the hydrogen anneal and using a (110) substrate. The abscissa represents a drive current density Ion in the unit of "mA/µm", and the ordinate represents an off leak current density Ioff in the unit of "A/µm". In FIG. 8, circle with center dot symbols indicate the measured results of the n-type MISFET's of the embodiment, and solid rhombus symbols indicate the measured results of the n-type MISFET's of the comparative example without the hydrogen anneal. A gate width Wg was 0.1 µm, and a drain voltage Vd was 1.1 V. A threshold voltage was set to 0.3 V higher than a standard voltage. In order to raise the threshold voltage, a channel concentration is made higher than that of an n-type MISFET having a standard threshold voltage.

It is understood that the on/off current characteristics of an n-type MISFET is improved by performing the hydrogen anneal.

Figure 9:
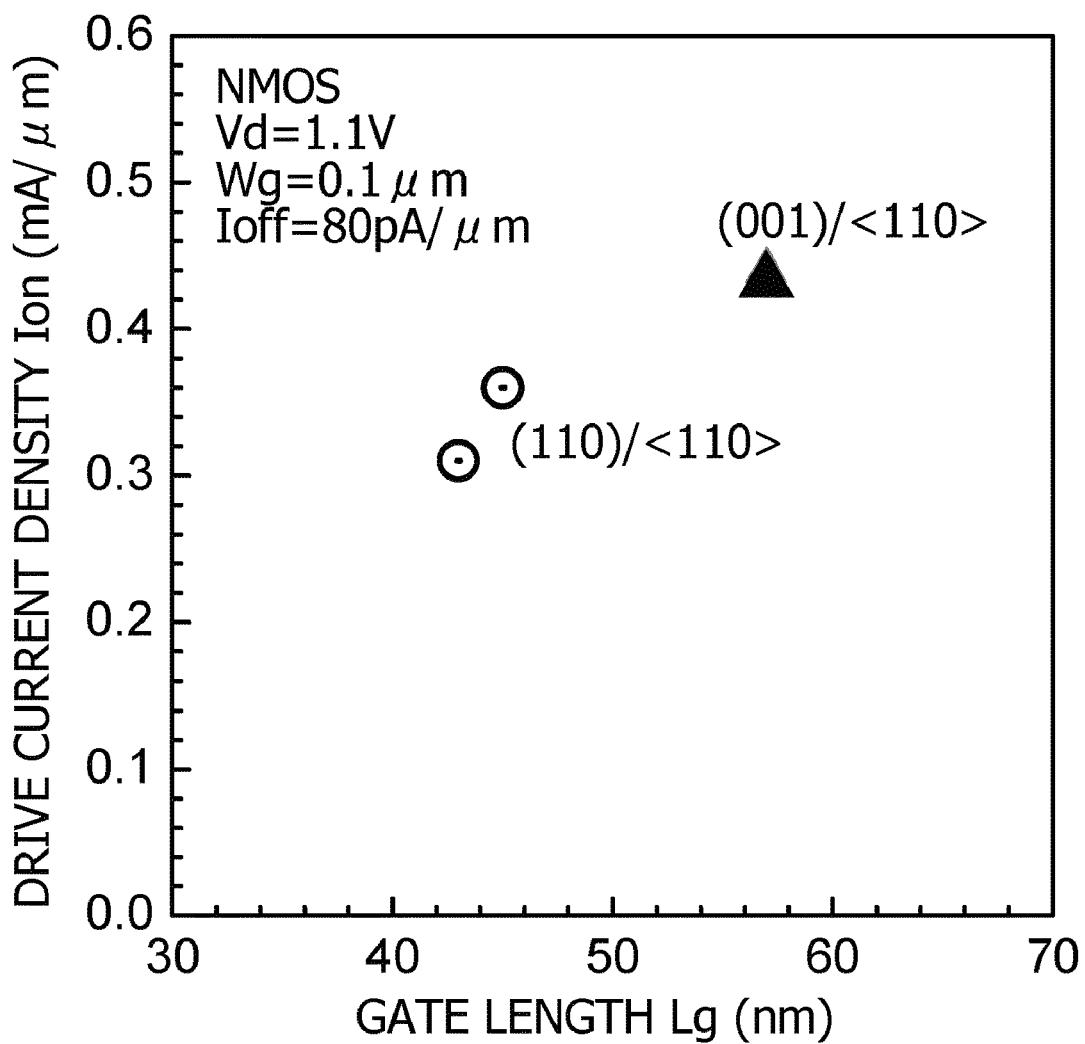
FIG. 9 is a graph illustrating a relation between a gate length and a drive current of an n-type MISFET of an embodiment having a threshold value higher than a standard value and an n-type MISFET formed on a (001) substrate.

FIG. 9 illustrates a relation between a gate length Lg and a drive current density Ion of an n-type MISFET having a high channel concentration and an off leak current density of 80 pA/µm. The abscissa represents a gate length Lg in the unit of "nm", and the ordinate represents a drive current density Ion in the unit of "mA/µm". Circle with center dot symbols and solid triangle symbols in FIG. 9 indicate measured results of n-type MISFET's of the embodiment and comparative example using a (001) substrate, respectively. By adopting the structure of the embodiment, it becomes possible to shorten the minimum operation gate length more than that using a (001) substrate.

Figure 10:
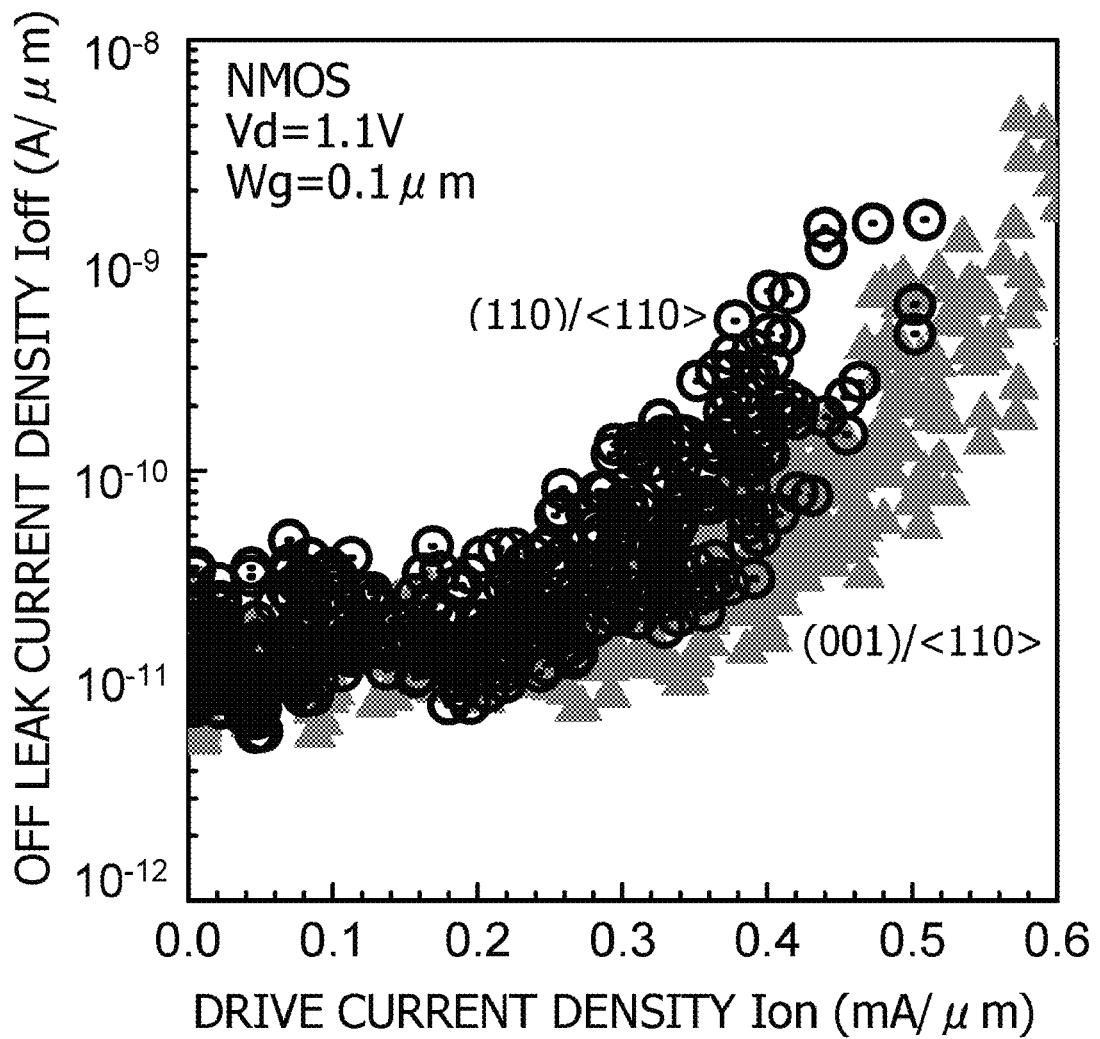
FIG. 10 is a graph illustrating measured results of the on/off current characteristics of an n-type MISFET of an embodiment having a threshold value higher than a standard value and an n-type MISFET formed on a (001) substrate.

FIG. 10 illustrates measured results of the on/off current characteristics of n-type MISFET's of the embodiment having a higher threshold voltage than a standard value by raising a channel concentration compared to measured results of n-type MISFET's manufactured on a (001) substrate. The abscissa represents a drive current density Ion in the unit of "mA/μm", and the ordinate represents an off leak current density Ioff in the unit of "A/μm". A gate width Wg was 0.1 μm, and a drain voltage Vd was 1.1 V. A threshold voltage was set to 0.3 V higher than a standard voltage.

The on/off current characteristics of the n-type MISFET's of the embodiment illustrated in FIG. 6 are compared with the characteristics of the n-type MISFET's of the embodiment illustrated in FIG. 10. The n-type MISFET having a lower channel concentration illustrated in FIG. 6 has the characteristics nearer to the characteristics of the n-type MISFET of the comparative example formed on a (001) substrate. Namely, if a channel concentration is low, there exist the considerable effects of suppressing the on/off current characteristics from being lowered.

As a channel concentration is made high, an electron mobility in the channel lowers. Therefore, as the channel concentration is made high, a change in the on/off current characteristics becomes insensitive to a change in an electron mobility. In the n-type MISFET having a high channel concentration illustrated in FIG. 10, the less effects of suppressing the on/off current characteristics from being lowered is considered to be caused by the characteristics being insensitive to a change in an electron mobility.

If the hydrogen anneal has an only effect of widening effective gate width, the suppression effects of the on/off current characteristics of the n-type MISFET having a high channel concentration illustrated in FIG. 10 should have the same degree as the suppression effects of the on/off characteristics of the n-type MISFET having a low channel concentration illustrated in FIG. 6. A difference of the hydrogen anneal effects between high and low channel concentrations is considered to be caused by appearance of the effects of suppressing an electron mobility from being lowered by the (111) and (331) planes formed just under the gate electrode in addition to the effective gate width being widened.

FIG. 11 illustrates the on/off current characteristics of n-type MISFET's having gate widths Wg of 0.1 μm and 1 μm. An upper graph illustrates measured results of n-type MISFET's manufactured with the hydrogen anneal, and a lower graph illustrates measured results of n-type MISFET's manufactured without the hydrogen anneal. Circle with center dot symbols and solid triangle symbols in FIG. 11 indicate measured results of the n-type MISFET's having gate widths Wf of 0.1 μm and 1 μm, respectively. The gate length Lg was 45 nm.

It is understood from comparison between the upper and lower graphs that as the gate width Wg is narrowed, the hydrogen anneal effects are enhanced.

FIG. 12 illustrates a relation between a gate width Wg and a drive current density Ion. The abscissa represents a gate width Wg in the unit of "μm", and the ordinate represents a normalized drive current density. The gate length Lg was 45 nm. Solid circle symbols and solid triangle symbols in FIG. 12 indicate measured results of n-type MISFET's of the embodiment with the hydrogen anneal and n-type MISFET's of the comparative example without the hydrogen anneal.

A drive current density of the n-type MISFET of the comparative example without the hydrogen anneal is little dependent on a gate width Wg. In contrast, in the n-type MISFET of the embodiment with the hydrogen anneal, as the gate width Wg becomes wider, the drive current density reduces and comes close to the drive current density of the n-type MISFET of the comparative example without hydrogen anneal. This is because as the gate width becomes wide, a ratio of an area occupied by the level surface 28E illustrated in FIG. 1J becomes high so that there is only a small difference from the n-type MISFET of the comparative example whose whole channel area is defined by the (110) plane. As the gate width Wg becomes narrow, a ratio of an area occupied by the first slope surface 28A to the fourth slope surface 28D becomes high and the hydrogen anneal effects appear remarkably.

With reference to FIGS. 13A and 13B, description will be made on the influence of the source-drain width Lsd upon the on/off current characteristics of an n-type MISFET.

FIG. 13B is a plan view of an n-type MISFET to be evaluated. An n-type MISFET is disposed in a rectangular active region 50. A gate electrode G intersects with the active region 50. A source S and a drain D are disposed on sides of the gate electrode G. A gate length Lg was 45 nm, and a gate width Wg was 0.1 μm. A size of the active region 50 in the gate length direction is defined as a source-drain width Lsd.

FIG. 13A illustrates measured results of the on/off current characteristics of three types of n-type MISFET's having different source-drain width Lsd. The abscissa represents a drive current density Ion in the unit of "mA/μm", and the ordinate represents an off leak current density Ioff in the unit of "A/μm". Solid square symbols, triangle with center dot symbols and circle with center dot symbols in FIG. 13A indicate measured results of n-type MISFET's having a source-drain width Lsd of 1.0 μm, 0.25 μm, and 0.115 μm, respectively. A variation in plots results from a variation in manufacture processes. It is understood that the on/off current characteristics is influenced little by the source-drain width Lsd.

FIG. 14 illustrates a relation between a source-drain width Lsd and a drive current density Ion. The abscissa represents a source-drain width Lsd in the unit of "μm", and the ordinate represents a normalized drive current density. A gate length Lg was 45 nm. Solid circle symbols and solid square symbols in FIG. 14 indicate measured results of n-type MISFET's having gate widths Wg of 0.1 μm and 0.4 μm, respectively.

In the n-type MISFET having a gate width Wg of 0.1 μm, a drive current density is less influenced by the source-drain width Lsd. In contrast, in the n-type MISFET having a gate width Wg of 0.4 μm, as the source-drain width Lsd becomes narrow, the drive current density reduces.

It is known that as compressive strain is generated in the channel region of an n-type MISFET manufactured on a (110) substrate, a channel mobility lowers. As the source-drain width Lsd becomes narrow, compressive strain is likely to be generated in the channel region because of the influence of stress contained in the element isolation insulating film. As compressive strain is generated in the channel region, an electron mobility lowers in the channel formed just under the (110) plane, i.e., the level surface 28E illustrated in FIG. 1J. It is considered that since a ratio of an area occupied by the level surface 28E illustrated in FIG. 1J is relatively high at a gate width Wg of 0.4 μm, a drive current density lowers under the influence of a lowered electron mobility.

In the n-type MISFET having a gate width Wg of 0.1 μm, the level surface 28E illustrated in FIG. 1J does not appear, or a ratio of an area occupied by the level surface 28E in the channel is low even if the level surface 28E appears. The drive current density is therefore specified by an electron mobility in the channel formed just under the slope surfaces 28A to 28D exposing the (111) and (331) planes. It is considered that even if compressive strain is generated in the channel region, an electron mobility in the channel formed just under the (111) and (331) planes does not lower substantially because the drive current density does not lower.

From the above-described evaluation results, it is found that a source-drain width Lsd of an n-type MISFET of the embodiment can be made shorter while the on/off current characteristics are maintained compared to that of a conventional n-type MISFET manufactured on a (110) substrate. Therefore, the n-type MISFET of the embodiment is suitable for miniaturization.

In the above-described embodiment, a crystal plane equivalent to (111) of silicon crystal and a crystal plane equivalent to (331) of silicon crystal appear just under the gate electrode, as illustrated in FIG. 1J. If the hydrogen anneal condition illustrated in FIG. 1I is adjusted, only a crystal plane equivalent to (111) or a crystal plan equivalent to (331) may appear. Also in the case wherein a crystal plane equivalent to only one of (111) and (331) appears, the effects like those of the above-described embodiment are obtained.

FIG. 15A is a cross sectional view illustrating a structure in which only a crystal plane equivalent to (111) appears. The first slope surface 28A and the third slope surface 28C constituted of the crystal plane equivalent to (111) appear, but the second slope surface 28B and the fourth slope surface 28D illustrated in FIG. 13 do not appear. In this case, the level surface 28E constituted of the (110) plane is continuous with the first slope surface 28A and the third slope surface 28C without the (331) plane therebetween. A ratio of the slope surfaces to the gate width Wg is defined by (Wg1+Wg3)/Wg.

FIG. 15B is a cross sectional view illustrating a structure in which only a crystal plane equivalent to (331) appears. The second slope surface 28B and the fourth slope surface 28D constituted of the crystal plane equivalent to (331) appear, but the first slope surface 28A and the third slope surface 28C illustrated in FIG. 13 do not appear. In this case, the second slope surface 28B and the fourth slope surface 28D directly contact the element isolation insulating film 15a. A ratio of the slope surfaces to the gate width Wg is defined by (Wg2+Wg4)/Wg.

If a ratio of an area occupied by the first slope surface 28A to the fourth slope surface 20D in the gate width Wg illustrated in FIG. 1J is too low, this case has substantially no difference from the case in which only a crystal plane equivalent to (110) appears under the gate electrode. In order to obtain sufficient effects of the above-described embodiment, it is preferable that a ratio (Wg1+Wg2+Wg3+Wg4)/Wg of an area occupied by the first slope surface 28A to the fourth slope surface 28D in the gate width direction is set equal to or higher than 30%.

In the above-described embodiments, the hydrogen anneal is performed in the process illustrated in FIG. 1I to migrate Si atoms. If an oxide film is formed on a silicon surface, migration of Si atoms is difficult to occur. By using the hydrogen atmosphere, it becomes possible to prevent formation of an oxide film and facilitate migration of Si atoms. Instead of hydrogen, heat treatment may be performed in a rare gas atmosphere such as Ar.

In the above-described embodiments, well doping and channel doping are performed as illustrated in FIG. 1G before the hydrogen anneal process illustrated in FIG. 1I. Ion implantation is not performed after the hydrogen anneal, and as illustrated in FIG. 1K, a gate insulating film is formed immediately after hydrogen anneal. It is therefore possible to improve the quality of the gate insulating film.

However, the well doping and the channel doping may be preformed after the hydrogen anneal. As the well doping and the channel doping are preformed after the hydrogen anneal, it becomes possible to prevent re-diffusion of dopants generated during hydrogen anneal.

In the above-described embodiments, although Si is used as the semiconductor substrate, SiGe may also be used. SiGe particularly having an atomic composition ratio of Ge to SiGe equal to or lower than 30% demonstrates the characteristics similar to those of Si. It is therefore expected that it is possible to obtain the effects like those of the above-described embodiments.

In the above-described embodiments, a MISFET having a general source/drain structure is used by way of example as illustrated in FIG. 1P. The hydrogen anneal may be applied to a MISFET having other structures. For example, the hydrogen anneal may be applied to a MISFET having a source and a drain of an elevated structure, a MISFET having strain in a channel to be caused by SiGe buried in the source and drain, and other MISFET's.

MISFET's of the above-described embodiments may be applied to semiconductor integrated circuits such as logic circuits, SRAM's, DRAM's and the like, power transistors, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a substrate including an active region made of Si or SiGe formed in a surface part of the substrate;
a gate electrode disposed over the active region, a gate insulating film disposed between the gate electrode and the substrate;
a source and a drain formed in the surface part of the substrate on sides of the gate electrode,
wherein a surface of the active region under the gate electrode includes a slope surface being upward from a border of the active region toward an inner side of the active region, and the slope surface has a crystal plane equivalent to (331), and
wherein the slope surface comprises a portion having a crystal plane equivalent to (111) and extending from the border of the active region toward the inner side of the active region and a portion continuous to the crystal plane equivalent to (111) having a crystal plane equivalent to (331) and extending further toward the inner side of the active region.

2. The semiconductor device according to claim 1, wherein the surface of the active region under the gate electrode comprises a level portion having a crystal plane equivalent to (110) in an area inner than the slope surface.

3. The semiconductor device according to claim 1, wherein a ratio of an area occupied by the slope surface to a gate width corresponding to a length from one border to another border of a portion of the active region overlapping the gate electrode is equal to or higher than 30%.

4. The semiconductor device according to claim 2, wherein a crystal plane equivalent to (331) extending from one border of the active region toward the inner side of the active region is in contact with a crystal plane equivalent to (331) extending from another border of the active region toward the inner side of the active region.

5. The semiconductor device according to claim 1, wherein a pair of borders of the active region is disposed in parallel to a <110> direction of Si or SiGe, and the gate electrode is disposed to intersect with a pair of borders of the active region parallel to the <110> direction and extends in a direction parallel to a <001> direction.

6. A semiconductor device comprising:
a substrate defining an active region on a surface thereof;
a gate electrode disposed over the active region, a gate insulating film disposed between the gate electrode and the substrate;
a source and a drain formed in a surface part of the substrate on sides of the gate electrode, wherein a surface of the active region under the gate electrode comprises a crystal plane equivalent to (111) and a crystal plane equivalent to (331) and a slope surface being upward from a border of the active region toward an inner side of the active region, and
wherein the slope surface comprises a portion having a crystal plane equivalent to (111) and extending from the border of the active region toward the inner side of the active region and a portion continuous to the crystal plane equivalent to (111) having a crystal plane equivalent to (331) and extending further toward the inner side of the active region.

7. The semiconductor device according to claim 6, wherein: the gate electrode is disposed intersecting with the active region as viewed in plan.

8. The semiconductor device according to claim 6, wherein the surface of the active region under the gate electrode comprises a level portion having a crystal plane equivalent to (110) in an area inner than the slope surface.

9. The semiconductor device according to claim 6, wherein a ratio of an area occupied by the slope surface to a gate width corresponding to a length from one border to another border of a portion of the active region overlapping the gate electrode is equal to or higher than 30%.

10. The semiconductor device according to claim 6, wherein a crystal plane equivalent to (331) extending from one border of the active region toward the inner side of the active region is in contact with a crystal plane equivalent to (331) extending from another border of the active region toward the inner side of the active region.

11. The semiconductor device according to claim 6, wherein a pair of borders of the active region is disposed in parallel to a <110> direction of Si or SiGe, and the gate electrode is disposed to intersect a pair of borders of the active region parallel to the <110> direction and extends in a direction parallel to a <001> direction.

* * * * *